US008081045B1

(12) United States Patent
Zeweri et al.

(10) Patent No.: US 8,081,045 B1

(45) Date of Patent: Dec. 20, 2011

(54) BEAMFORMER POWER DIVIDER/COMBINER WITH TRANSMISSION LINES DISTRIBUTED BETWEEN MMIC AND ASSOCIATED PC BOARD

(75) Inventors: Mirwais Zeweri, Mount Laurel, NJ (US); Daniel W. Harris, Mount Laurel, NJ (US); Steven R. Long, Evesham, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 554 days.

(21) Appl. No.: 12/188,507

(22) Filed: Aug. 8, 2008

(51) Int. Cl.
*H03H 7/38* (2006.01)

(52) U.S. Cl. ........................................ 333/124; 333/136

(58) Field of Classification Search .................. 333/100, 333/124, 136, 246, 247, 238; 342/81, 153, 342/157, 158, 373, 375; 343/853
See application file for complete search history.

(56) References Cited

U.S. PATENT DOCUMENTS

| | | | | |
|---|---|---|---|---|
| 4,739,448 | A * | 4/1988 | Rowe et al. | 361/719 |
| 4,875,087 | A * | 10/1989 | Miyauchi et al. | 257/664 |
| 5,017,927 | A | 5/1991 | Agrawal et al. | |
| 6,650,200 | B2 * | 11/2003 | Culliton et al. | 333/124 |
| 7,023,295 | B2 * | 4/2006 | Ko et al. | 333/128 |
| 7,755,449 | B2 * | 7/2010 | Song | 333/33 |
| 2007/0266281 | A1 * | 11/2007 | Kwark | 714/724 |
| 2009/0224848 | A1 * | 9/2009 | Lindmark | 333/159 |
| 2010/0039187 | A1 * | 2/2010 | Yurugi et al. | 333/136 |

OTHER PUBLICATIONS

U.S. Appl. No. 11/856,767, filed Sep. 18, 2007 in the name of Pluymers et al, and entitled Planar Beamformer Structure.

* cited by examiner

*Primary Examiner* — Robert Pascal
*Assistant Examiner* — Alan Wong
(74) *Attorney, Agent, or Firm* — Howard IP Law Group, PC

(57) ABSTRACT

A beamformer includes an integrated-circuit power divider/combiner including a common port. A first transmission line extends from the common port to an individual port on the integrated circuit substrate. A first portion of a second transmission line extends on the substrate from the individual port to an integrated-circuit port. A second portion of the second transmission line extends from the integrated-circuit port vertically through plural layers of an underlying printed-circuit board stack. The characteristic impedances of the first and second portions of the second transmission line, and their combined length, are selected to match the impedance at the individual port to a standard impedance.

16 Claims, 24 Drawing Sheets

BEAMFORMER POWER DIVIDER/COMBINER WITH TRANSMISSION LINES DISTRIBUTED BETWEEN MMIC AND ASSOCIATED PC BOARD

This invention was made with Government Support under Contract No. N00024-05-C-5346 awarded by the Department of the Navy. The Government has certain rights in this invention.

BACKGROUND OF THE INVENTION

Those skilled in the arts of antenna arrays and beamformers know that antennas are transducers which transduce electromagnetic energy between unguided- and guided-wave forms. More particularly, the unguided form of electromagnetic energy is that propagating in “free space,” while guided electromagnetic energy follows a defined path established by a “transmission line” of some sort. Transmission lines include coaxial cables, rectangular and circular conductive waveguides, dielectric paths, and the like. Because of the delay associated with transmission of energy along transmission lines, they are sometimes known as delay lines. Antennas are totally reciprocal devices, which have the same beam characteristics in both transmission and reception modes. For historic reasons, the guided-wave port of an antenna is termed a “feed” port, regardless of whether the antenna operates in transmission or reception. The beam characteristics of an antenna are established, in part, by the size of the radiating portions of the antenna relative to the wavelength. Small antennas make for broad or nondirective beams, and large antennas make for small, narrow or directive beams. When more directivity (narrower beamwidth) is desired than can be achieved from a single antenna, several antennas may be grouped together into an “array” and fed together in a phase-controlled manner, to generate the beam characteristics of an antenna larger than that of any single antenna element. The structures which control the apportionment of power to (or from) the antenna elements are termed “beamformers,” and a beamformer includes a beam port and a plurality of element ports. In a transmit mode, the signal to be transmitted is applied to the beam port and is distributed by the beamformer to the various element ports. In the receive mode, the unguided electromagnetic signals received by the antenna elements and coupled in guided form to the element ports are combined to produce a beam signal at the beam port of the beamformer. A salient advantage of sophisticated beamformers is that they may include a plurality of beam ports, each of which distributes the electromagnetic energy in such a fashion that different beams may be generated simultaneously.

Radar systems often use multiple antenna beams for tracking of disparate targets, and sometimes for tracking single targets. One scheme for use of multiple beams involves monopulse techniques, in which angle tracking information is obtained from multiple beams, ideally with but a single transmitted pulse. Monopulse operation is accomplished by generating two, or more usually three, antenna beams, so that the simultaneously received echoes from the multiple beams can be compared. The usual monopulse beams are a sum (Σ) beam, and azimuth (Az) and elevation (El) difference (Δ) beams. Monopulse systems are described in many publications, as for example in U.S. Pat. No. 5,017,927 issued May 21, 1991 in the name of Agrawal et al. Agrawal et al. in one arrangement uses three separate beamformers, namely Σ, Az Δ, and El Δ beamformers, to generate the three different beams. These beamformers can be manifested in an array of a plurality of elevation Σ, Az Δ, and El Δ column beamformers which connect to the antenna elements, and an array of azimuth Σ, Az Δ, and El Δ row beamformers, which connect the E, Az Δ, and El Δ ports to the column beamformers.

FIG. 1 is a representation of a prior-art array antenna as described in the above-mentioned Agrawal et al. patent. As described therein in FIG. 1, radar system 10 includes an antenna array 12 including a set 14 of individual antennas or antenna elements $14^{1}$, $14^{2}$, $14^{3}$, . . . $14^{N-2}$, $14^{N-1}$, and $124^{N}$ arrayed in a column designated $16^{1}$. Other columns $16^{2}$, $16^{3}$ . . . $16^{N}$ are illustrated in a general manner as being located behind column $16^{1}$, so as to form a two-dimensional rectangular array of antenna elements.

Each antenna element $14^{1}$, $14^{2}$ . . . $14^{N}$ of columns $16^{1}$, $16^{2}$, . . . $16^{N}$ of antenna array 12 of FIG. 1 is associated with a phase shifter 18. For example, elemental antenna $14^{1}$ of column $16^{1}$ is associated with a phase shifter $18^{1}$. Similarly, each of the elemental antennas $14^{2}$, $14^{3}$ . . . $14^{N}$ of column $16^{1}$ are associated with a phase shifter $18^{2}$, $18^{3}$ . . . $18^{N}$. As also illustrated in FIG. 1, phase shifter $18^{1}$ has an output transmission line (cable) $20^{1}$ which, together with output cable $20^{N}$ of phase shifter $18^{N}$ of column $16^{1}$, is connected to a sum-and-difference hybrid circuit $22^{1}$. Each of cables $20^{1}$ and $20^{N}$ is connected to a separate input port (input) of hybrid circuit $22^{1}$. It will be noted that phase shifters $18^{1}$ and $18^{N}$ are associated with elemental antennas $14^{1}$ and $14^{N}$, the first and last (top and bottom) antenna elements of column $16^{1}$. Similarly, the output of phase shifter $18^{2}$ is coupled by way of a cable $20^{2}$ to a second sum-and-difference hybrid splitter $22^{2}$, together with the output from phase shifter $18^{N-1}$, coupled by way of a cable $20^{N-1}$. Phase shifter $18^{2}$ is associated with antenna element $14^{2}$, the second antenna element, and phase shifter $18^{N-1}$ is associated with penultimate antenna element $14^{N-2}$. A third sum-and-difference hybrid combining arrangement $22^{3}$ receives inputs from the third antenna element $14^{3}$ and its phase shifter $18^{3}$ by way of cable $20^{3}$, and from antepenultimate antenna element $14^{N-2}$ and its phase shifter $18^{N-2}$ by way of cable $20^{N-2}$, respectively. It can be seen that the outputs of the antenna elements of column $16^{1}$ and their phase shifters are taken in pairs symmetrically disposed above and below the center of column $16^{1}$, and the antenna outputs are combined in an array of sum-and-difference hybrids. The combination or array of sum-and-difference hybrids 22 associated with column $16^{1}$ is designated $24^{1}$.

Each of the other columns of FIG. 1, such as column $16^{2}$, $16^{3}$ . . . $16^{N}$, includes (not illustrated) its own column array of antenna elements 14 and phase shifters 18, each of which is associated with an antenna 14. Each of the other columns is also associated with an array 24 (not illustrated) of sum-and-difference hybrids 22. Only antenna array column $16^{N}$ is illustrated in FIG. 1 as being connected by cables 20 to its associated sum-and-difference hybrid array $24^{N}$.

In the arrangement of FIG. 1, the sum output produced at the upper output of hybrid $22^{1}$ of hybrid array $24^{1}$, is coupled by way of a cable $26^{1}$ to an input of a sum combiner or beamformer $30^{1}$. Similarly, the upper or sum (Σ) outputs of sum-and-difference hybrids $22^{2}$ and $22^{3}$, and all the other hybrids (not illustrated) of hybrid array $24^{1}$, are coupled by a cable 26 to sum combiner $30^{1}$, which combines the sum signals, and which couples the combined sum signals to a single output cable $34^{1}$. Similarly, the difference (Δ) output ports of sum-and-difference hybrids $22^{1}$, $22^{2}$, $22^{3}$, . . . $22^{n/2}$ of hybrid array $24^{1}$ of FIG. 1 are each connected by way of a transmission line 28 to separate inputs of a difference combiner or beamformer $32^{1}$. Thus, the Δ (lower) output port of hybrid $22^{1}$ is connected by way of a cable $28^{1}$ to a first input of Δ combiner $32^{1}$, the a output port of hybrid $22^{2}$ is coupled by way of a cable $28^{2}$ to a second input of Δ combiner $32^{1}$, and the Δ output port of hybrid $22^3$ is coupled by cable $28^3$ to a third input of Δ combiner $32^1$. All the other hybrids (not illustrated) of hybrid array $24^1$ have their Δ output ports coupled to a Δ combiner $32^1$ in a similar manner. Combiner 32' combines the ' signals and couples their sum to an output cable 36'.

Each of the other hybrid arrays $24^2$ . . . $24^M$ (only $24^M$ illustrated) of FIG. 1 are connected to an associated pair of sum and difference combiners or beamformers in the same manner. The $M^{th}$ hybrid array, namely $24^M$, is illustrated in FIG. 1, together with some of its cables 20, and also with some connection 26 to last column Σ combiner $30^M$. As so far described, all the columns $16^1$ through $16^M$ ultimately produce a sum signal from a column sum combiner 30 on a cable 34, and a difference signal from a column Δ combiner 32 on a cable 36. Thus, there are M cables 34, and M cables 36, one for each column 16. Elemental phase shifters 18 can be adjusted so that the input signals to column Σ combiners 30 add in-phase for a desired antenna beam pointing direction. Difference signals to column Δ combiner 32 will add in-phase only if cable pairs $26^N$ and $28^N$ are phase matched for all N, provided that the Σ and Δ combiners for each column have identical topologies. First cable $34^1$ and last cable $34^M$ from sum combiners $30^1$ and $30^M$, respectively, are coupled to individual inputs of a sum-and-difference hybrid designated $38^1$. The outputs from the second ($30^2$) and penultimate ($30^{M-1}$) combiners (not illustrated) are coupled over cables $34^2$ and $34^{N-1}$ to separate input ports of a second sum-and-difference hybrid $38^2$. Similarly the third ($30^3$) and antepenultimate ($30^{M-2}$) sum combiners 30 (not illustrated) have their outputs coupled by way of cables $34^3$ and $34^{M-2}$, respectively, to a sum-and-difference hybrid $38^3$. Other sum-and-difference hybrids (not illustrated) together with hybrids $38^1$, $38^2$, and $38^3$, form an array $40^M$ of sum-and-difference hybrids. Each hybrid of array $40^M$ receives inputs from a pair of column sum combiners 30 associated with a pair of columns 16, the columns of which are symmetrically disposed to the left and right of the center of array 12.

The sum outputs of the hybrids of hybrid array $40^M$ of FIG. 1 are each separately coupled by way of a cable 44 to a separate input of an azimuth sum combiner 48. For example, hybrid $38^1$ has its Σ output connected by way of a cable $44^1$ to an input of azimuth combiner 48, hybrid $38^2$ has its Σ output connected by a cable $44^2$ to another input of azimuth combiner 48, and hybrid $38^3$ has its Σ output connected by way of a cable $44^3$ to a third input of azimuth sum combiner 48. Azimuth sum combiner combines the Σ signals and produces the combined Σ signal on a cable 50 for application to a processing and display unit illustrated as 70. The Δ outputs of each of sum-and-difference hybrids 38 of hybrid array 40 of FIG. 1 are each separately coupled by way of a cable 46 to separate inputs of an azimuth Δ combiner 52. For example, the Δ output of hybrid 381 is connected by way of a cable $46^1$ to an input of azimuth Δ combiner 52, the Δ output of hybrid $38^2$ is connected to a second input of azimuth Δ combiner 52 by way of a cable $46^2$, and the Δ output of hybrid $38^3$ is connected by way of a cable $46^3$ to yet another input of combiner 52. Combiner 52 combines the Δ signals and applies the combined signals over a cable 54 to processing and display unit 70 of radar unit 10. Another array 41 of sum-and-difference hybrids, each of which is designated as 42 in FIG. 1, is coupled to the array of M column Δ combiners 32 (only combiner $32^1$ is illustrated), in much the same fashion that array 40 of hybrids 38 is coupled to an array of M sum combiners 30. For example, sum-and-difference hybrid $42^1$ receives inputs by way of cables $36^1$ and $36^M$ from first and last column Δ combiners $32^1$ and $32^M$ (not illustrated). Sum-and-difference hybrid $42^2$ is connected by way of cable $36^2$ and $36^{M-1}$ to the second and penultimate column Δ combiner 32 (not illustrated), and hybrid $42^3$ has its inputs connected by way of cables $36^3$ and $36^{M-2}$ to the third and antepenultimate column Δ combiners 32. Other hybrids 42 of array 41 are connected to other pairs of combiners symmetrically disposed to the left and right about the center of array 12.

The sum outputs of each of sum-and-difference hybrids 42 of array 41 of FIG. 1 are coupled by way of separate cables 56 to separate inputs of an elevation Δ combiner 62. For example, hybrid $42^1$ has its sum output connected by way of a cable $56^1$ to a first input of combiner 62, and the sum outputs of hybrids $42^2$ and $42^3$ are connected by separate cables $56^2$ and $56^3$, respectively, to other inputs of elevation Δ combiner 62. Elevation Δ combiner 62 combines the column Δ signals to produce an elevation Δ signal on a cable 64 for application to processing and display unit 70. The difference (Δ) outputs of sum-and-difference hybrids 42 of hybrid array 41 of FIG. 1 are not used and are terminated. For example, the Δ output of hybrid $42^1$ is coupled by way of cable $58^1$ to a termination $60^1$, and the Δ outputs of hybrids $42^2$ and $42^3$ are coupled by cables $58^2$ and $58^3$ to terminations $60^2$ and $60^3$, respectively.

A transmitter 72 associated with radar system 10 of FIG. 1 is coupled to processing and display unit 70 for timing the signals, for providing appropriate demodulation reference signals, and for other purposes. Also, a transmitter signal is applied to cable 50 of azimuth sum combiner 48, as suggested by dotted lines 74 within processing and display unit 70. The transmitter signals are coupled through azimuth combiner 48 and back through the arrays of hybrids and combiners, which in the context of transmission may act as splitters, to ultimately produce signals at antenna elements 14, which signals are phased in a manner appropriate for directing radiation in a particular direction.

The complexity of the beamforming arrangement of FIG. 1 is apparent. Additional complexity arises because of the amplitude weighting of the signals relative to each other in each column 16, and from column to column, in order to achieve the appropriate beam sidelobe levels for both elevation and azimuth beams. Even if phase shifters 18 are set correctly, assuming equal phase signals arriving at the phase shifters, cumulative phase errors through the combiners and hybrid arrays may adversely affect the performance. In this regard, it should be noted that the actual physical lengths of interconnecting cables such as $20^1$, $20^2$ . . . $20^M$ must be nearly equal for wide bandwidth signals, and some cables such as $26^N$ and $28^N$ must have the same electrical length as well, even though the distances over which the signals must be carried may be less than the physical lengths This in turn tends to create a problem relating to excess cable lengths associated with the shorter paths, which excess cable lengths must be stored out of the way.

FIG. 2A is a simplified block diagram of a monopulse antenna array arrangement as described by Agrawal et al. Elements of FIG. 2A corresponding to those of FIG. 1 are designated by the same reference numerals. Array 12 of FIG. 2A includes a plurality of columns $216^1$, $216^2$, $216^3$ . . . $216^M$, corresponding generally to columns 16 of FIG. 1. Each column 216 of FIG. 2A includes a vertical array of N antenna elements 14, such as $14^1$, $14^2$, $14^3$ . . . $14^{N-2}$, $14^{N-1}$, and $14^N$. Each antenna element 14 of each column 216 is associated with a transmit-receive processor or module (TR Proc). Thus, antenna element $14^1$ of column $216^1$ is associated with a TR Proc $218^1$, elemental antenna $14^2$ is associated with TR Proc $218^2$, and antenna $14^N$ is associated with TR Proc $218^N$. Structurally, all TR Procs 218 are identical, although their adjustable portions (phase shifters, attenuators and/or switches) may be set differently.

As illustrated in FIG. 2A, each transmit-receive processor 218 has three outputs, designated 219, 220, and 221. For simplicity, the outputs of the TR processors are designated by the same reference numerals as that of the cables to which they are attached. Thus, outputs $\mathbf{219}^1$, $\mathbf{220}^1$ and $\mathbf{221}^1$ of TR Proc $\mathbf{218}^1$ of column $\mathbf{216}^1$ are connected to cables $\mathbf{219}^1$, $\mathbf{220}^1$ and $\mathbf{221}^1$, respectively. In a similar manner, the three outputs of TR Proc $\mathbf{218}^2$ of column $\mathbf{216}^1$ are connected to cables $\mathbf{219}^2$, $\mathbf{220}^2$ and $\mathbf{221}^2$, respectively. The three outputs of TR Proc $\mathbf{218}^N$ of column $\mathbf{216}^1$ are separately connected to cables $\mathbf{219}^N$, $\mathbf{220}^N$ and $\mathbf{221}^N$. As illustrated in FIG. 2A, the topmost or first TR processor $\mathbf{218}^1$ of column $\mathbf{216}^2$ is seen to be associated with output cables $\mathbf{219}^1$, $\mathbf{220}^1$, and $\mathbf{221}^1$. In column $\mathbf{216}^M$, TR processor $\mathbf{218}^1$ is associated with cables $\mathbf{219}^1$, $\mathbf{220}^1$, and $\mathbf{221}^1$. As in the case of FIG. 1, of course, all the columns $\mathbf{216}^2$ . . . $\mathbf{216}^N$ are identical to column $\mathbf{216}^1$.

The arrangement of FIG. 2A includes a Σ beamformer 230, an azimuth Δ beamformer 229, and an elevation Δ beamformer 231. All the cables 219 connected to TR processors 218 of array 12 are gathered in rows and columns in azimuth Δ beamformer 229. For example, all the cables $\mathbf{219}^1$ from TR processors $\mathbf{218}^1$ of all M columns 216 are separately connected to separate inputs located along a top row of beamformer 229. Similarly, all the cables $\mathbf{219}^2$ from all the M TR processors $\mathbf{218}^2$ of all columns 216 of array 12 are gathered and connected to the second row of inputs (not illustrated in FIG. 2A) of azimuth Δ beamformer 229.

FIG. 2B illustrates the connections of TR processors 218 of FIG. 2A to azimuth Δ beamformer 229 of FIG. 2A. In FIG. 2B, the connection face of beamformer 229 is seen in elevation view, with some of the inputs illustrated as dots. The connection face of beamformer 229 contains M×N input ports, one for each TR Proc 218, laid out as M columns and N rows. As can be seen, the upper row of inputs of beamformer 229 for columns 1, 2, 3 . . . M−2, M−1, M are each connected to a cable $\mathbf{219}^1$. The second row of connections of beamformer 229 is to cables $\mathbf{219}^2$, and the bottommost row of connections on the connection face of beamformer 229 receives cables $\mathbf{219}^N$.

Sum beamformer 230 of FIG. 2A is connected to receive cables 220 in a same manner in which beamformer 229 is arranged to receive cables 219. That is, the topmost row of the connection face (not illustrated) of sum beamformer 230 is connected to cables $\mathbf{220}^1$ from all M columns. The second row is connected to cables $\mathbf{220}^2$, and so forth, until the lowermost row is connected to all cables $\mathbf{220}^N$ from all M columns. Elevation Δ beamformer 231 is similarly connected to receive cables 221 from all TR Procs 218 of array 12. Azimuth Δ beamformer 229 of FIG. 2A collects all the signals provided over cables 219 to form an azimuth difference signal which is coupled out over a cable 54. In the context of a radar system, cable 54 may be connected to a processor and display unit as described in conjunction with FIG. 1. Similarly, sum beamformer 230 and elevation difference beamformer 231 combine the signals from cables 220 and 221, respectively, to produce combined signals on cables 50 and 64, respectively.

FIG. 3 illustrates one possible arrangement for interconnecting the transmit-receive processors 218 of the arrangement of FIG. 2A, as set forth in the Agrawal et al. patent. In FIG. 3, elements corresponding to those of FIGS. 1 and 2A are designated by the same reference numerals. In FIG. 3, only column 216 and a portion of column $\mathbf{216}^M$ are illustrated. Each column of the array, including columns $\mathbf{216}^1$ and $\mathbf{216}^M$, is associated with three individual column beamformers designated 329, 330 and 331. In FIG. 3, azimuth Δ column beamformer $\mathbf{329}^1$ is connected to receive cables $\mathbf{219}^1$, and all other cables $\mathbf{219}^2$, $\mathbf{219}^N$ of TR processors $\mathbf{218}^2$-$\mathbf{218}^N$ of column 216. Column $\mathbf{216}^1$ sum beamformer $\mathbf{330}^1$ receives inputs from cables $\mathbf{220}^1$, $\mathbf{220}^2$, $\mathbf{220}^2$, . . . $\mathbf{220}^{N-2}$, $\mathbf{220}^{N-1}$, and $\mathbf{220}^N$. Elevation Δ column beamformer $\mathbf{331}^1$ is connected to receive cable $\mathbf{221}^1$ from TR processor $\mathbf{218}^1$ of column $\mathbf{216}^1$ and cables $\mathbf{221}^2$ . . . $\mathbf{221}^N$ from the remaining TR processors 218 of column $\mathbf{216}^1$. Thus, column $\mathbf{216}^1$, and all other columns 216 of array 12, is associated with three column beamformers, one for sum, one for azimuth Δ and the other for elevation Δ. Thus, cables $\mathbf{220}^1$, $\mathbf{220}^2$, $\mathbf{220}^3$ . . . connect from TR processors $\mathbf{218}^1$, $\mathbf{218}^2$, $\mathbf{218}^3$ of column $\mathbf{216}^M$ to sum column beamformer 330. Although not illustrated in FIG. 3, column M azimuth difference beamformer $\mathbf{329}^M$ is connected to cables $\mathbf{219}^1$, $\mathbf{219}^2$ . . . from the TR processors of column $\mathbf{216}^M$, and column M elevation Δ beamformer $\mathbf{331}^M$ is connected to cables $\mathbf{221}^1$, $\mathbf{221}^2$ . . . $\mathbf{221}^N$ from the TR processors 218 of column $\mathbf{216}^1$. Each column beamformer $\mathbf{329}^1$-$\mathbf{329}^M$ of FIG. 3 produces a signal on an output cable $\mathbf{349}^1$-$\mathbf{349}^M$. All cables $\mathbf{349}^1$ . . . $\mathbf{349}^M$ are connected to corresponding inputs of an array azimuth Δ beamformer 339, which combines the column signals to produce an array azimuth Δ signal on a cable 54. Similarly, elevation Δ column beamformers $\mathbf{331}^1$ . . . $\mathbf{331}^M$ each produce a combined output on a corresponding cable $\mathbf{351}^1$ . . . $\mathbf{351}^M$, which are all connected to an array elevation Δ beamformer 341, which combines the signals to produce a combined elevation Δ signal on cable 64. Finally, each sum column beamformer $\mathbf{330}^1$ . . . $\mathbf{330}^M$ combines its signals to produce a combined signal on a corresponding cable $\mathbf{350}^1$ . . . $\mathbf{350}^M$. All cables $\mathbf{350}^1$ . . . $\mathbf{350}^M$ are connected to corresponding inputs of an array sum beamformer 340, which combines the signals to produce a combined sum signal on a cable 50. Array Σ beamformer 340 of FIG. 3, together with M associated column Σ beamformers 330, may be considered equivalent to sum beamformer 230 of FIG. 2A. Similarly, AZ Δ beamformer 229 of FIG. 2A corresponds to the combination of azimuth Δ beamformer 339 of FIG. 3 with a plurality equal to M of column AZ Δ beamformers 329. Elevation Δ beamformer 231 of FIG. 2A corresponds to the combination of elevation Δ beamformer 341 of FIG. 3 with all M of the column EL Δ beamformers 331.

More recent array antenna arrangements may generate more than three separate beams. In general, each beam is associated with a port of the beamformer. An overlap beamformer feeds at least some, and often most, elements of an antenna array with energy for multiple beams, and the number of beams may exceed three. Inexpensive and reliable interconnection(s) of the beamformer(s) with the antenna elements are desirable, but the topology of the connections tends to make conventional approaches tends to require a great deal of hand work and checking of connections against drawings. This hand work, in turn, tends to reduce the reliability of the connections, and increases the cost of the connections.

In FIG. 4, a plurality of rectangular or square planar dielectric circuit boards lie in a coplanar array 410. Each circuit board defines a broad upper side and a broad lower side, and each also defines four straight edges. The illustrated array 410 may be only a portion of a larger array made up of similar additional circuit boards. The illustrated circuit boards are designated 412*a*, 412*b*, 412*c*, 412*d*, 412*f*, and 412*g*. Other boards are illustrated in phantom, and ellipses indicate that the array may extend beyond the portion shown. The boards of FIG. 4 are supported by some underlying structure, illustrated as a support 490. An interstice, "gap" or interface lies between each board of array 410 and the next adjacent board on each side. Thus, a gap 414*ab* lies between mutually adjacent circuit boards 412_a_ and 412_b_, a gap 414_bc_ lies between mutually adjacent circuit boards 412_b_ and 412_c_, a gap 414_fg_ lies between mutually adjacent circuit boards 412_f_ and 412_g_, a gap 416_bd_ lies between mutually adjacent circuit boards 412_b_ and 412_d_, a gap 416_cf_ lies between mutually adjacent circuit boards 412_c_ and 412_f_, and a gap 416_bg_ lies between mutually adjacent circuit boards 412_b_ and 412_g_. It will be noted that the gaps of set 414 of gaps have their directions (or axes) of elongation perpendicular to the directions of elongation of set 416 of gaps.

FIG. 5A is a plan or top view of a portion of an array of circuit boards similar to array 410 of FIG. 4, and corresponding elements are designated by like reference alphanumerics. For convenience, the array of FIG. 5A is designated 500. In addition to the circuit boards of set 500, FIG. 5A includes a set 510 of elevation Monolithic Microwave Integrated Circuits (MMICs) and a set 516 of azimuth (Az) MMICs.

The description herein includes relative placement or orientation words such as "top," "bottom," "up," "down," "lower," "upper," "horizontal," "vertical," "above," "below," as well as derivative terms such as "horizontally," "downwardly," and the like. These and other terms should be understood to refer to the orientation or position then being described, or illustrated in the drawing(s), and not to the orientation or position of the actual element(s) being described or illustrated. These terms are used for convenience in description and understanding, and do not require that the apparatus be constructed or operated in the described position or orientation. Similarly, terms concerning mechanical attachments, couplings, and the like, such as "connected," "attached," "mounted," refer to relationships in which structures are secured or attached to one another either directly or indirectly through intervening structures, as well as both movable and rigid attachments or relationships, unless expressly described otherwise.

In FIG. 5A, the elevation MMICs of set 510 "bridge" the gaps between the circuit boards of set 500 of boards, and make connection to the circuit boards on each side of the gap. Thus, a first MMIC designated 510$bc_1$ bridges gap 414_bc_ lying between circuit boards 412_b_ and 412_c_. Similarly, a second MMIC designated 510$bc_2$ also bridges gap 414_bc_ lying between circuit boards 412_b_ and 412_c_. A MMIC designated 510$cz_1$ bridges gap 414_cz_ lying between circuit boards 412_c_ and 412_z_. Similarly, another MMIC designated 510$cz_2$ also bridges gap 414_cz_ lying between circuit boards 412_c_ and 412_z_. A MMIC designated 510$ab_1$ bridges gap 414_ab_ lying between circuit boards 412_a_ and 412_b_. Similarly, a MMIC designated 510$ab_2$ also bridges gap 414_ab_ lying between circuit boards 412_a_ and 412_b_. A MMIC designated 510$f\Omega_1$ bridges gap 414_f_Ω lying between circuit boards 412_f_ and 412Ω. Similarly, a MMIC designated 510 $f\Omega_2$ also bridges gap 414_f_Ω lying between circuit boards 412_f_ and 412Ω. A MMIC designated 510$fg_1$ bridges gap 414_fg_ lying between circuit boards 412_f_ and 412_g_. Similarly, a MMIC designated 510$fg_2$ also bridges gap 414_fg_ lying between circuit boards 412_f_ and 412_g_. For completeness, a MMIC designated 510$gh_1$ bridges gap 414_gh_ lying between circuit boards 412_g_ and 412_h_. Similarly, a MMIC designated 510$gh_2$ also bridges gap 414_gh_ lying between circuit boards 412_g_ and 412_h_.

It will be noted that the gaps of set 414 of gaps of FIG. 5A which are bridged by elevation MMICs of set 510 of MMICs are mutually parallel. That is, gaps 414_ab_, 414_bc_, 414_cz_, 414_fg_, 414_gh_, and 414_f_Ω are all parallel. The gaps of set 416 of gaps are orthogonal to the gaps of set 414, and are bridged by azimuth MMICs of a set 516 of azimuth MMICs. More particularly, gap 416_bd_ of set 416 of gaps, lying between circuit boards 412_b_ and 412_d_, is bridged by an azimuth MMIC 516_bd_, a gap 416_cm_ lying between circuit boards 412_c_ and 412_m_ is bridged by a MMIC 516_cm_, gap 416_ag_ lying between circuit boards 412_a_ and 412_g_ is bridged by a MMIC 516_ag_, and similarly a gap 416_cf_ is bridged by a MMIC 516_cf_, a gap 416_f_Ψ is bridged by a MMIC 516_f_Ψ, and a gap 416_g_Φ, is bridged by a MMIC 416_g_Φ. It will be appreciated that the MMICs of sets 510 and 516 do not simply bridge their respective gaps, but that they also make connection by way of electrically conductive vias, pins, terminals, sockets, or other electrical conductors, to various conductors or transmission lines laid out on, or associated with the various circuit boards of set 412 of boards, as described hereinbelow.

The circuit boards of set 412 of FIG. 5A make contact not only with the various MMICs, but also make connections for beam ports and connections for antenna elements (or for TR modules associated with antenna elements, if provided). More specifically, various dots laid out on the circuit boards of FIG. 5A represent the locations of ports for connection to the antenna elements or their associated TR modules. In this context, a "port" may be in the form of an electrical connection associated with a transmission line. For example, circuit board 412_f_ of FIG. 5A has one antenna element port designated "port 2." Each circuit board of the embodiment illustrated in FIG. 5A has sixteen such ports, each of which is for connection (possibly by way of a TR module) to one antenna element of a subarray of sixteen antenna elements. The sixteen antenna element (or associated T/R module) connection ports of circuit board 412_b_ of FIG. 5A are designated 1110, 1112, 1114, 1116, 1118, 1120, 1122, 1124, 1126, 11128, 1130, 1132, 1134, 1136, 1138, and 1140. Each circuit board of FIG. 5A has a single "beam" port at which the desired array antenna beam is generated, which ports are not illustrated in FIG. 5A.

FIG. 5B is a cross-section of one possible embodiment of the structure of FIG. 5A taken at section line 5_b_-5_b_. In FIG. 5B, the Az MMICs are shown as having rows of connection pins (seen as a single pin in this view) which makes contact with at least one conductor layer (not illustrated) of the circuit boards. More particularly, the connection pins of MMIC 516_bd_ are designated 516_bd_P, the connection pins of MMIC 516_bg_ are designated 516_bg_P, and the connection pins of MMIC 516_g_Φ are designated 516_g_ΦP. These pins allow each MMIC to couple to each of the adjacent circuit boards, and ultimately allows the flow of signal among the circuit boards, across the gap lying between the circuit boards. While not expressly illustrated in FIG. 5B, the El MMICs of FIG. 5A similarly make contact with their underlying circuit boards by means of rows of connection pins.

FIG. 6A is a plan view of the upper surface of a single circuit board of FIG. 5A, showing the RF terminal and connection (pin, via, socket, or other electrical conductor) layout. For definiteness, the circuit board of FIG. 6A is designated as being board 412_b_. In FIG. 6A, the layout of connection locations for the azimuth MMIC 516_bg_ is designated Az1 and contains connection locations A1, A2, A3, and A4, as well as connection locations A7, A8, and A9. The layout of connection locations for azimuth MMIC 516_bd_ are designated Az2 and include connection locations A5, A6, as well as A10 and A11. It will be understood that the connection locations Az1 and Az2 are continuations of each other on opposite sides of the circuit board. The connection locations for the azimuth MMICs are laid out in two straight lines, with six locations (A1 through A6) in a first row and with five locations (A7 through A11) in a second row. Thus, a first Az MMIC can be mounted with some of its pins (if provided) in set Az1 of electrically conductive via, terminal, pin, or socket connections of FIG. 6A, and another similar Az MMIC can be mounted with the "remaining" pins in set Az2.

As mentioned, each circuit board has one "beam" port connection (electrically conductive pin, via, socket, terminal or the like) at which the desired receive beam is generated. The single beam port in FIG. 6A is the MMIC port connection designated A7 in pattern Az1. This beam port, and corresponding beam ports of all the circuit boards of FIG. 6A, may be coupled by signal paths to analog-to-digital converters and other or further beamforming processing, as known in the art.

FIG. 6B is a general bottom view representation of an azimuth MMIC module 616 which can be used in the arrangement of FIG. 5A, showing a pin (or other connection) layout compatible with the Az1 and Az2 portions of the circuit board of FIG. 6A, and also showing the location of the gap 616*g* which module 616 straddles. In FIG. 6B, the six connections or pins of a first row of Az module 616 are designated 616A1, 616A2, 616A3, 616A4, 616A5, and 616A6. Similarly, the five connections or pins in a second row are designated 616A7, 616A8, 616A9, 616A10, and 616A11. Pin, contact, via, terminal, or connection 616A7 is the beam port for one of the circuit boards associated with the azimuth module 616. In FIG. 6B, those connections designated with the "A" suffix with a numeral are spaced and arranged to mate with and make contact with connections having the corresponding A suffix and numeral of the circuit board of FIG. 6A. It should be remembered that the illustration of FIG. 6A is of the top of the board 412*b*, whereas the illustrations of FIGS. 6*b* and 6*c* are of the bottoms of MMICs, so there is an apparent "reversal" of the connection positions between the FIGURES. More particularly, connection 616A1 of integrated circuit 616 of FIG. 6B makes contact with connection A1 of circuit board 412*b* of FIG. 6A, connection 616A2 of integrated circuit 616 of FIG. 6B makes contact with connection A2 of circuit board 412*b* of FIG. 6A, connection 616A3 of integrated circuit 616 of FIG. 6B makes contact with connection A3 of circuit board 412*b* of FIG. 6A, and connection 616A4 of integrated circuit 616 of FIG. 6B makes contact with connection A4 of circuit board 412*b* of FIG. 6A. In addition, connection 616A5 of another integrated circuit similar to 616 of FIG. 6B makes contact with connection A5 of circuit board 412*b* of FIG. 6A, and connection 616A6 of this other integrated circuit makes contact with connection A6 of circuit board 412*b* of FIG. 6A. Further, connection 616A7 of integrated circuit 616 of FIG. 6B makes contact with connection A7 of circuit board 412*b* of FIG. 6A, connection 616A8 of integrated circuit 616 of FIG. 6B makes contact with connection A8 of circuit board 412*b* of FIG. 6A, and connection 616A9 of integrated circuit 616 of FIG. 6B makes contact with connection A9 of circuit board 412*b* of FIG. 6A. Further, connection 616A10 of an integrated circuit similar to 616 of FIG. 6B makes contact with connection A10 of circuit board 412*b* of FIG. 6A, and connection 616A11 of this other integrated circuit makes contact with connection A11 of circuit board 412*b* of FIG. 6A.

As described below, various connections, pins, vias or electrical conductors of Az MMIC 616 of FIG. 6B make connection to other functional structures of the system. More particularly, pins or connections 616A1, 616A2, 616A3, 616A4, 616A5, and 616A6 of MMIC 616 are for making azimuth-to-azimuth connections, connection or pin 616A7 is for connection to a beamforming port. Connections or pins 616A8, 616A9, 616A10, and 616A11 are for connection to elevation modules, for receipt of signals therefrom in reception mode.

Also illustrated on Azimuth IC 616 of FIG. 6B are blocks bearing designations corresponding to the functions (3:1; dual 2:1; 4:1, etc.) which are connected within the MMICs to the various connections or pins thereof. These are described in more detail below.

Also visible in FIG. 6A are the connection locations for the elevation MMICs corresponding to those making connection to circuit board 412*b* of FIG. 5A. More particularly, FIG. 6A shows a first elevation layout El1 of connections, which may be in the form of electrically conductive sockets, vias, terminals, pins, or other conductive paths. The connection layout or pattern of first elevation layout El1 includes a line of connections E1, E2, E3, and E4, together with a single connection E5 at one end of the pattern, and a further single connection E6 at the other end. The layout of these connections is selected to register with or match the connection or pin layout on one side of an elevation MMIC. The connections for the other side of an elevation MMIC are illustrated by a further layout E12 in FIG. 6A. Layout E12 includes a line of four connections E9, E10, E11, and E12, and two single connections adjacent the ends of the pattern. The two single connections are designated E7 and E8.

FIG. 6C is a plan view of the bottoms of a pair of elevation MMICs, designated as 510*bc*1 and 510*bc*2, corresponding to two side-by-side MMICs illustrated in FIG. 5A. In FIG. 6C, the connection or pin layouts of the two MMICs are identical. Thus, it is only necessary to describe one of the layouts to make the other clear. In MMIC 510*bc*1(B) of FIG. 6C a line of four connections (electrically conductive vias, sockets, terminals, pins, or other electrical conductors) 620E1, 620E2, 620E3, and 620E4 extends across an "upper" long side. Connector 620E1 is one end of a line of connectors including connectors 620E5, 620E7, and 620E9, which extend "vertically" to the "lower" long edge of MMIC 510*bc*1(B). Similarly, connector 620E4 is at an upper end of a line of connectors including connectors 620E6, 620E8, and 620E12, which line extends vertically to the lower long edge of the MMIC. As can be seen, connectors 620E1, 620E2, 620E3, 620E4, 620E5, and 620E6 lie on an upper side of gap 620*g*, and connectors 620E7, 620E8, 620E9, 620E10, and 620E11 lie on a lower side of the gap, indicated in FIG. 6C by line 620*g*.

When MMIC 510*bc*1(B) of FIG. 6C is mounted across or straddling the gap between mutually adjacent circuit boards, such as gap 414*bc* of FIG. 5A, its connectors mate with the connectors of the circuit boards on either side of the gap. More particularly, connectors 620E1, 620E2, 620E3, 620E4, 620E5, and 620E6 of the MMIC mate with connectors E1, E2, E3, E4, E5, and E6, respectively, of pattern El1 of FIG. 6A. Similarly, the connectors 620E7, 620E8, 620E9, 620E10, 620E11, and 620E12 mate with the connectors of the next adjacent circuit board, which are illustrated in FIG. 6A as connectors E7, E8, E9, E10, E11, and E12 of pattern E12. It should be noted that FIG. 6C illustrates as blocks certain power dividers or combiners in MMIC 510*bc*1(B) which connect to various ones of the connectors associated with the MMIC. The connections of these blocks are described below.

As described below, various connectors of El MMIC 510*bc*1(B) of FIG. 6C make connection to other functional structures of the antenna beamforming system. More particularly, connections 620E1, 620E5, 620E7, and 620E9 of MMIC 510*bc*1(B) are for making connections to four of the associated antenna elements (or their T/R modules), connection or pin 620E4 is for connection to an azimuth MMIC, connections or pins 620E2, 620E3, 620E8, 620E10, 620E11, and 620E12 are for connection to other elevation MMIC modules, and connection or pin 620E6 is for a transmit connection.

It should be noted that the term "between" and other terms such as "parallel" have meanings in an electrical context which differ from their meanings in the field of mechanics or in ordinary parlance. More particularly, the term "between" in the context of signal or electrical flow relating to two separate devices, apparatuses or entities does not relate to physical location, but instead refers to the identities of the source and destination of the flow. Thus, flow of signal "between" A and B refers only to source and destination, and the signal flow itself may be by way of a path which is nowhere physically located between the locations of A and B. The term "between" can also define the end points of the electrical field extending between points of differing voltage or potential, and the electrical conductors making the connection need not necessarily lie physically between the terminals of the source. Similarly, the term "parallel" in an electrical context can mean, for digital signals, the simultaneous generation on separate signal or conductive paths of plural individual signals, which taken together constitute the entire signal. For the case of electrical current, the term "parallel" means that the flow of a current is divided to flow in a plurality of separated conductors, all of which are physically connected together at disparate, spatially separated locations, so that the current travels from one such location to the other by plural paths, which need not be physically parallel.

FIG. 7 illustrates receive-function internal connections among the ports and functional blocks of an Azimuth MMIC module such as 616 of FIG. 6B. The transmit function is not shown. In FIG. 7, representative Az MMIC 616 is connected to receive signals from the elevation modules at connections or pins 616A8, 616A9, 616A10, and 616A11. Signals from the elevation (El) modules are coupled between connections or pins 616A8 and 616A9 and the common ports 710*c*1 and 710*c*2 of a dual 1:3 splitter or coupler 710, and other elevation signals are coupled between connections or pins 616A10 and 616A11 and common or input ports 712*c*1 and 712*c*2 of a dual 3:1 splitter or coupler 712. These dual 1:3 couplers may produce two sets of three-way divided signal in receive operation. More particularly, dual 1:3 coupler 710 produces three pairs of independent signals, one pair of which is carried by way of a path 714 to an individual or input port pair of dual 2:1 coupler 716, another pair of which is carried by a path 718 to an individual or input port pair of 4:1 coupler 720, and a last pair of which is carried by a path 722 to an individual or input port pair of 3:1 coupler 724. Similarly, dual 1:3 coupler 712 produces three pairs of independent signals in receive operation, one pair of which is carried by way of a path 726 to individual input ports of a 3:1 coupler 728, another pair of which is carried by a path 730 to individual input ports of dual 2:1 coupler 716, and a last pair of which is carried by a path 732 to individual input ports of 4:1 coupler 720. A first common output port 716*c*1 of dual 2:1 coupler 716 is connected as an input to 3:1 coupler 728, and a second common output port 716*c*2 of dual 2:1 coupler 716 is coupled by way of a path 734 as an input to 3:1 coupler 724. The common port 728*c* of 3:1 coupler 728 is connected to MMIC connection or pin 616A6. The common port 724*c* of 3:1 coupler 724 is connected to MMIC connection or pin 616A3. The common port 720*c* of 4:1 coupler 720 is connected by a path 736 to MMIC connection or pin 616A4. Three-to-one (3:1) coupler 738 is coupled to receive signal from MMIC connections or pins 616A1, 616A2, and 616A5. The common port 738*c* of coupler 738 is connected to beamformer connection or pin 616A7.

FIG. 8 illustrates internal connections among the ports and functional blocks of an Elevation MMIC module such as 510*bc*1(B) of FIG. 6C. In FIG. 8, representative El MMIC 510*bc*1(B) is connected to receive antenna element signals at connections or pins 620E1, 620E5, 620E7, and 620E9. Signals are coupled between connection or pin 620E1 and a first common port 810*c*1 of a dual 3:1 coupler 810, and between connection or pin 620E5 and a second common port 810*c*2 of dual 3:1 coupler 810. Coupler 810 has three sets 810*i*1, 810*i*2, and 810*i*3 of individual or independent ports. A pair of signal paths 812 extends between the set or pair of individual ports 810*i*1 of coupler 810 and a pair of individual ports of a 3:1 coupler 814. A pair of signal paths 816 extends between the set or pair of individual ports 810*i*2 of dual 3:1 coupler 810 and a pair of independent ports of a 4:1 coupler 818. A pair of signal paths 820 extends between a set or pair of individual ports 810*i*3 of dual 3:1 coupler 810 and a set of independent ports of a dual 2:1 coupler 822. Similarly, signals are coupled between connection or pin 620E7 of FIG. 8 and a first common port 830*c*1 of a dual 3:1 coupler 830, and between connection or pin 620E9 and a second common port 830*c*2 of dual 3:1 coupler 830. Dual 3:1 coupler 830 has three sets of individual or independent ports 830*i*1, 830*i*2, and 830*i*3. A pair of signal paths 832 extends between the set or pair of individual ports 830*i*1 and a second pair of individual ports of dual 2:1 coupler 822. A pair of signal paths 834 extends between the set or pair of individual ports 830*i*2 of coupler 830 and a second pair of independent ports of 4:1 coupler 818. A pair of signal paths 836 extends between a set or pair of individual ports 830*i*3 of coupler 830 and a set of independent ports of a 3:1 coupler 840. One common port 822*c*1 of dual 2:1 coupler 822 is connected by a path 842 to an individual port of 3:1 coupler 840. Another common port 822*c*2 of dual 2:1 coupler 822 is connected by a path 844 to an individual port of 3:1 coupler 814. The common port 814*c* of 3:1 coupler 814 is connected by a path 846 to an individual port of 3:1 coupler 848. The common port 840*c* of 3:1 coupler 840 is connected by a path 850 to an individual port of "final" 3:1 coupler 848. The common port 818*c* of 4:1 coupler 818 is connected by a path 852 to a third individual port of "final" 3:1 coupler 848. The common port 848*c* of coupler 848 is connected to connection or pin 620E4.

The elevation MMIC arrangement of FIG. 8 as described provides for electrical connection to only four antenna elements. Each planar connection board, however, provides connection to sixteen antenna elements. The sixteen connections come about because there are four elevation MMIC modules associated with each planar beamformer circuit board, each making connection to four antenna elements. For example, planar beamformer circuit board 412*b* of FIG. 5A is associated with four elevation MMIC modules, namely modules $\mathbf{510}ab_1$, $\mathbf{510}ab_2$, $\mathbf{510}bc_1$, and $\mathbf{510}bc_2$.

FIG. 9 is a diagram illustrating some of the connections made to the azimuth MMIC modules, such as azimuth modules 516*bd* and 516*ag* of FIG. 5A, by electrically conductive traces defined in one or more layers (not separately illustrated) of circuit board 412*b* of FIG. 5A. Those skilled in the art will recognize that, in order to define proper transmission lines, one or more reference voltage points or ground planes must be defined among the various layers of the circuit board(s) in addition to the interconnection traces. Since these ground planes are well understood in the art, they are not expressly illustrated. In FIG. 9, elements corresponding to those of FIGS. 5*a* and 6*a* are designated by like reference alphanumerics. In FIG. 9, pin, via, socket, terminal or connection A1 of Azimuth pattern AZ1 is connected to connection A4 by a transmission-line path (path) 910, a path 912 connects connection A2 of AZ1 to connection A6 of pattern AZ2, and a path 914 connects connection A3 of AZ1 to connection A5 of AZ2. In FIG. 9, a path 915 connects a connection A9 of azimuth MMIC pattern AZ1 to connection E4 of elevation pattern EL1, and a path 916 connects connection A8 of AZ1 to a connection E4 of elevation pattern EL901.

Also in FIG. 9, a path 918 connects connection A10 of azimuth pattern AZ2 to a connection E4 of elevation pattern EL903, and a path 920 connects connection A11 of azimuth pattern AZ2 to a connection E4 of elevation pattern EL902.

FIG. 10 is a diagram illustrating additional connections which may be made on one or more layers of printed-circuit board 412*b*. In FIG. 10, elements corresponding to those of FIG. 9 are designated by the same alphanumerics. A path 1010 extends from pin, via, socket, terminal, or other connection E10 of elevation pattern EL905 to connection E2 of elevation pattern EL902, a path 1012 extends from connection E11 of elevation pattern EL905 to connection E3 of elevation pattern EL902, and a path 1014 extends from connection E8 to connection E12 of elevation pattern EL905. A path 1020 extends from connection E10 of elevation pattern EL906 to connection E2 of elevation pattern EL903, a path 1022 extends from connection E11 of elevation pattern EL906 to connection E3 of elevation pattern EL903, and a path 1024 extends from connection E8 to connection E12 of elevation pattern EL906. A path 1030 extends from connection E10 of elevation pattern EL2 to connection E2 of elevation pattern EL1, a path 1032 extends from connection E11 of elevation pattern EL2 to connection E3 of elevation pattern EL901, and a path 1034 extends from connection E8 to connection E12 of elevation pattern EL2. Also, a path 1040 extends from pin, via, socket, terminal, or other connection E10 of elevation pattern EL904 to connection E2 of elevation pattern EL901, a path 1042 extends from connection E11 of elevation pattern EL904 to connection E3 of elevation pattern EL901, and a path 1044 extends from connection E8 to connection E12 of elevation pattern EL904.

FIG. 11 is a diagram illustrating additional connections which may be made on one or more layers of printed-circuit board 412*b*. In FIG. 11, elements corresponding to those of FIGS. 9 and 10 are designated by the same alphanumerics. In FIG. 11, pins, vias, sockets, terminals, or other connections 1110, 1112, 1114, 1116, 1118, 1120, 1122, 1124, 1126, 1128, 1130, 1132, 1134, 1136, 1138, and 1140 are for connecting the various antenna elements (or their associated T/R modules) associated with the beamformer connection board 412*b* to the elevation MMICs (not illustrated in FIG. 11). In other words, these connections are the antenna connections for the receive mode of operation. A signal path 1150 of FIG. 11 extends from connection E7 of elevation pattern EL905 to beamformer connection 1110, and a signal path 1152 extends from connection E9 to beamformer connection 1112. Signal paths 1154 and 1156 extend from connections E7 and E9 of elevation pattern EL906 to beamformer connections 1114 and 1116, respectively. Signal paths 1158 and 1160 extend from connections E7 and E9 of elevation pattern EL2 to beamformer connections 1118 and 1120, respectively. Signal paths 1162 and 1164 extend from connections E7 and E9 of elevation pattern EL904 to beamformer connections 1122 and 1124, respectively. Signal paths 1166 and 1168 extend from connections E1 and E5 of elevation pattern EL902 to beamformer connections 1126 and 1128, respectively. Signal paths 1170 and 1172 extend from connections E1 and E5 of elevation pattern EL903 to beamformer connections 1130 and 1132, respectively. Signal paths 1174 and 1176 extend from connections E1 and E5 of elevation pattern EL1 to beamformer connections 1134 and 1136, respectively. Signal paths 1178 and 1180 extend from connections E1 and E5 of elevation pattern EL901 to beamformer connections 1138 and 1140, respectively.

The beamforming performed in association with planar beamformer circuit board 412*b* of FIG. 11 produces a single beam upon reception, and the signal as received on this beam appears at port A7 of pattern Az1 at the lower right of the FIGURE. The signals received on the antenna beam defined by the receive beamformer 412B are connected to external utilization devices.

As so far described, the planar beamformer circuit boards have been destined for "central" locations of the array, which is to say locations at which adjacent beamformer circuit boards are coupled to all four edges. In these locations, signals are coupled to each beamformer from antenna elements of the array which are directly connected to the beamformer circuit board, and from antenna elements which are not directly connected to the beamformer circuit board. Thus, the received signals processed by each beamformer circuit board arise both from the antenna elements to which it is directly connected, and from antenna elements indirectly connected by way of other beamformer circuit boards. This results in an "overlap" of connectivity, in which each antenna element provides receive signal to more than one receive antenna beam. When N beamformer circuit boards are juxtaposed and connected in an array as described in conjunction with FIG. 5A, N individual beams can be generated. Each separate beam can be controlled, as known in the art, by adjusting the signal phases in the T/R modules.

Any antenna array has a finite size. Consequently, it has antenna elements which are at a "corner" or an "edge" of the array. Planar beamformers arranged in an array cannot support MMICs which would bridge a "gap" between a circuit board and the "missing" next adjacent circuit board. Thus, some beamformer circuit boards may be missing a mating beamformer circuit board at one edge in the case of an "edge" circuit board, and may be missing mating circuit boards along two edges in the case of a "corner" circuit board. Such beamformer circuit boards at the "edges" or "corners" of the beamformer array may require different circuit connections than those described for the case of "center" beamformer circuit boards. The different circuit connections are illustrated in FIG. 12. In FIG. 12, a "corner" connected board is designated 1212, and an "edge" board is designated 1214. The "free" edges of the array including boards 1212 and 1214 in FIG. 12 are designated F1 and F2, and other edges of boards 1212 and 1214 are connected to other portions of the array, as suggested by the outlines of the MMICs bridging gaps 1201, 1202, and 1203. In order to properly "terminate" connections which are not otherwise connected in an edge or corner circuit board, a "matched termination" as well known in the art is applied to the connection in question. The "matched termination" will often be simply a resistor connected to the connection or port and to reference ground, with the resistor value being related to the characteristic or surge impedance of the transmission line or of the element connected to the port. For example, connection or port 1110 of corner circuit board 1212 of FIG. 12 will ordinarily be connected by way of a transmission line (not illustrated) to the associated antenna element. The corner circuit board, however, does not have an associated antenna element to which port 1110 can be connected.

In FIG. 12, the locations of one end of each of the terminations, are indicated by dots. One set of four terminations is connected to terminals A5, A7, A10, and A11 of pattern AZ2 of board 1212. A set of six terminations is connected to terminals E7, E8, E9, E10, E11, and E12 of pattern EL905. A set of terminations is connected to terminals E7, E8, E9, E10, E11, and E12 of pattern EL906. A set of terminations is connected to terminals E7, E8, E9, E10, E11, and E12 of pattern EL2, and a set of terminations is connected to terminals E7, E8, E9, E10, E11, and E12 of pattern EL904. A similar set of terminations connects at the free edge F2 of board 1214 of FIG. 12. Those skilled in the art will know which other connections require such terminations.

FIG. 13 is a representation of two planar circuit boards 412*b* and 13412*b*, each including antenna ports. Some of the antenna ports of board 412*b* are designated 1110, 1112, . . . 1138, 1140. The antenna ports of board 412*b* are connected individually to antenna elements of a sixteen-element array or subarray 1310 by way of transmission lines designated together as 1314. Similarly, the antenna ports of board 13412*b* are connected individually to the antenna elements of a subarray 1312 by way of a plurality of transmission lines designated together as 1316.

Improved beamformers and interconnection arrangements therefor are desired.

SUMMARY OF THE INVENTION

Thus, a beamformer according to an aspect of the invention includes a power divider/combiner. The power divider/combiner includes a common port and first and second individual ports on an integrated-circuit substrate, and also includes a first transmission line, which may be a strip transmission line, extending from the common port to the first individual port on the integrated circuit substrate. The power divider/combiner also includes a second transmission line including first and second portions, the first portion of which may be in the form of a strip transmission line. The first portion of the second transmission line extends on the integrated-circuit substrate from the first individual port of the power divider/combiner to a second integrated-circuit port. The second portion of the second transmission line extends from the second integrated-circuit port vertically through plural layers of an underlying printed-circuit board stack to a third port. In an embodiment of such a beamformer, the characteristic impedances of the first and second portions of the second transmission line, and their combined length, are selected to match the impedance at the individual port to a standard impedance at the third port. The standard impedance at the third port may be 50 ohms.

A beamformer according to an aspect of the invention is for coupling antenna ports to at least one common port. The beamformer comprises a plurality of stripline printed-circuit boards. At least some of the printed-circuit boards include first and second juxtaposed dielectric sheets, and a strip conductor lying therebetween. The juxtaposed dielectric sheets of each of the stripline printed-circuit boards define broad first and second surfaces. The juxtaposed dielectric sheets of each of the stripline printed-circuit boards also include or are associated with electrically conductive ground conductors lying on the broad first and second surfaces of the juxtaposed dielectric sheets. The plurality of stripline printed-circuit boards are stacked with the electrically conductive ground conductors on the first broad side of one of the boards being in mechanical contact with the electrically conductive ground conductors on the second broad side of another one of the boards, to thereby define a layered stack structure. A plurality of power divider/combiners each include a common port, at least first and second individual ports, and resistances interconnecting the individual ports. At least one of the power divider/combiners includes first and second strip transmission lines extending from the common port to the first and second individual ports, respectively, on an integrated-circuit substrate. The integrated-circuit substrate is mounted on a ground conductor of the stack. The first transmission line has a lower characteristic impedance than the second transmission line. A further transmission line is coupled to the first individual port of the one of the power divider/combiners. The further transmission line comprises first and second portions. The first and second portions are connected end-to-end to define a single long further transmission line. The first portion of the further transmission line extends on the integrated-circuit substrate from the first individual port to a transition port of the integrated-circuit dielectric substrate. The transition port defines a boundary between on- and off-integrated-circuit-substrate. The second portion of the further transmission line extends from the transition port vertically through at least one layer of the stacked printed-circuit boards to a further standard-impedance port. The electrical length of the further transmission line is selected to be one-quarter wavelength at the frequency of operation of the beamformer. A further standard-impedance transmission line extends from the standard-impedance port to a standard-impedance load or source. In a particular embodiment, the second portion of the further transmission line extends through at least three layers of the layered structure.

A beamformer according to an aspect of the invention is for coupling antenna ports to at least one common port. The beamformer comprises a plurality of stripline printed-circuit boards. Each of the printed-circuit boards includes first and second juxtaposed dielectric sheets, at least some of which include a strip conductor lying therebetween. The juxtaposed dielectric sheets of each of the stripline printed-circuit boards define a dielectric layer defining broad first and second surfaces, and also include electrically conductive grounds or ground conductors lying on the broad first and second surfaces of the dielectric layer. The plurality of printed-circuit boards are stacked with the first broad side of one of the boards being in mechanical contact with the second broad side of another one of the boards, to thereby define a layered structure. The beamformer also includes a plurality of power divider/combiners. Each power divider/combiner includes a common port, at least first and second individual ports, and resistances interconnecting the individual ports. At least one of the power divider/combiners includes a first transmission line extending from the common port to the first individual port. At least portions of the first and second transmission lines are in the form of integrated strip conductors overlying an integrated-circuit dielectric substrate, which in turn overlies and is affixed to an electrically conductive ground plane. The first transmission line has a lower characteristic impedance than the second transmission line. The electrically conductive ground plane of the integrated circuit is mechanically affixed and electrically connected to the ground of the stack. The beamformer comprises a further transmission line coupled to the first individual port of the one of the power divider/combiners. The further transmission line comprises first and second portions. The first portion of the further transmission line extends from the first individual port to a transition port of the integrated-circuit dielectric substrate, and overlies the integrated-circuit dielectric substrate. The second portion of the further transmission line extends from the transition port vertically through at least one layer of the juxtaposed printed-circuit boards to a further standard-impedance port (that is, a 50Ω or 75Ω port). The length of the further transmission line is selected to be one-quarter wavelength at the frequency of operation of the beamformer. A further standard-impedance transmission line extends from the standard-impedance port to a standard-impedance load or source. In a particular embodiment of the beamformer, the second portion of the further transmission line extends through at least three layers of the layered structure.

DESCRIPTION OF THE INVENTION

Figure 1:
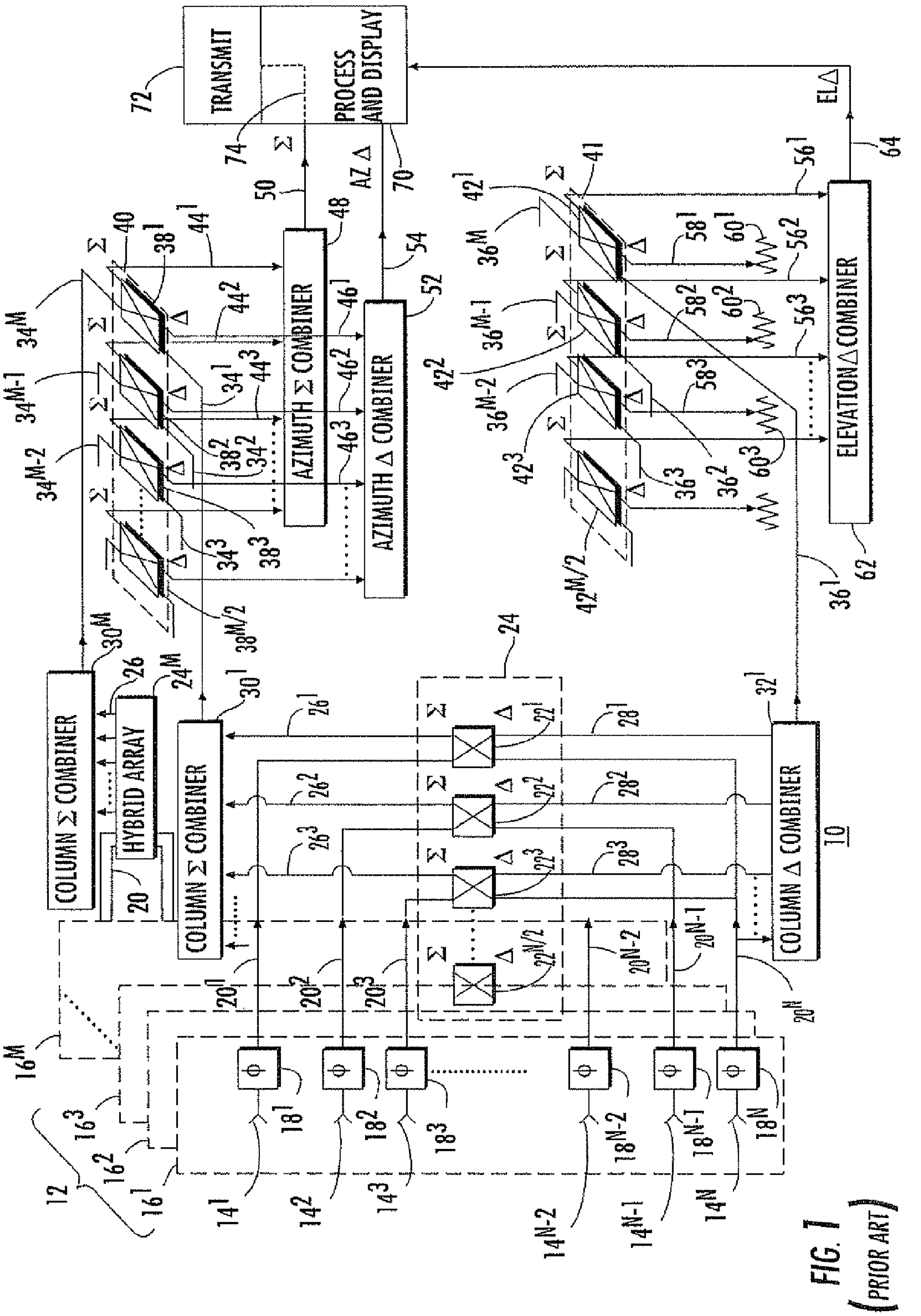
FIG. 1 (PRIOR ART)
FIG. 1 is a simplified block diagram of a prior art monopulse system using a phased-array antenna, illustrating the use of column sum-and-difference hybrids and combiners, to form column sum (Σ) and column difference (Δ) information, and the use of further sum-and-difference hybrids and further combiners to form the Σ, azimuth difference (AZ Δ) and elevation difference (EL Δ) beams, all as described in U.S. Pat. No. 5,017,927 issued May 21, 1991 in the name of Agrawal et al.
Figure 2A:
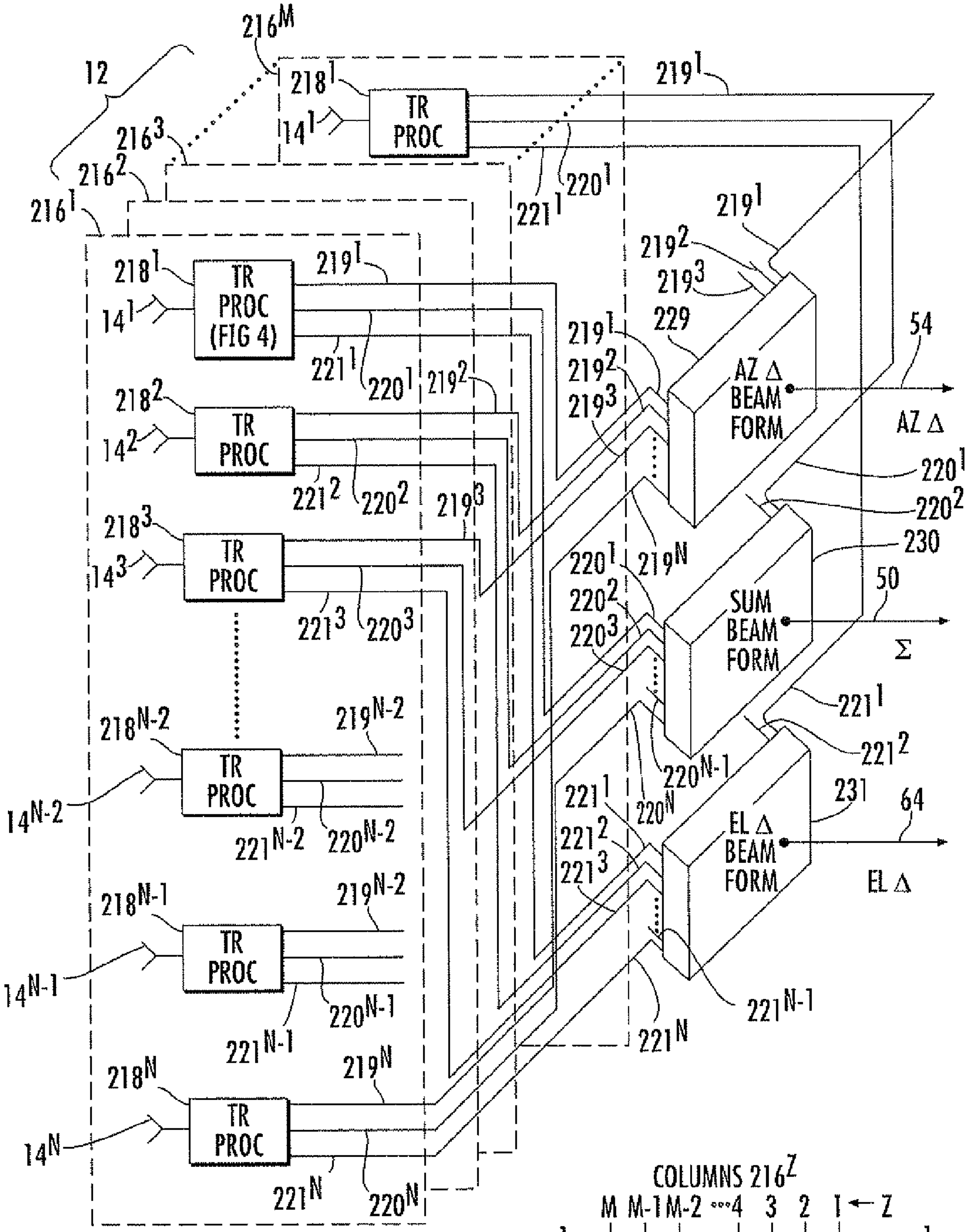
FIG. 2A (PRIOR ART)
FIG. 2A is a simplified block diagram of a prior art monopulse system as described by Agrawal et al., in which each antenna of the phased-array antenna is associated with a transmit-receive processor (TR Proc) or module, each with plural outputs, which system also includes plural beamformers.
Figure 2B:
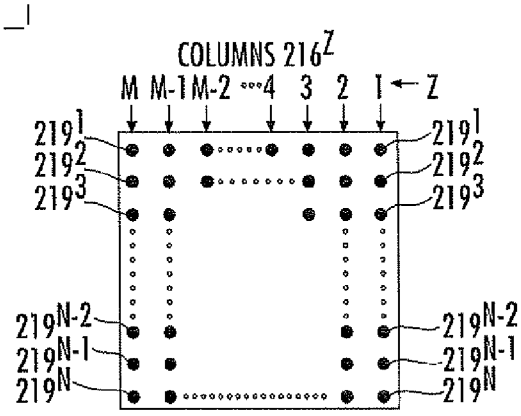
FIG. 2B illustrates some connections on one of the beamformers of FIG. 2A.
Figure 3:
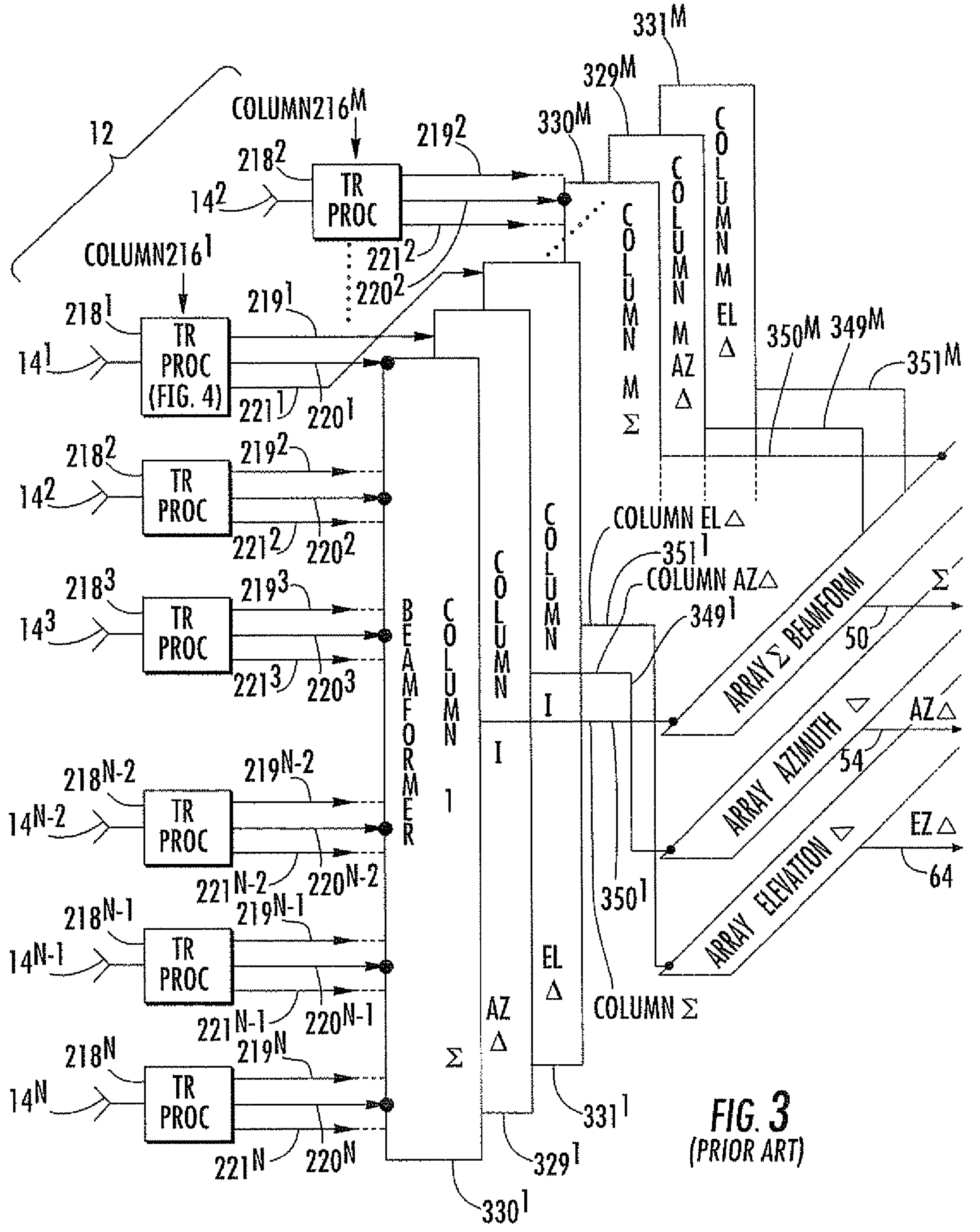
FIG. 3 (PRIOR ART)
FIG. 3 is a simplified block diagram of the arrangement of FIG. 2A, illustrating details of one embodiment of the prior art beamformers.
Figure 4:
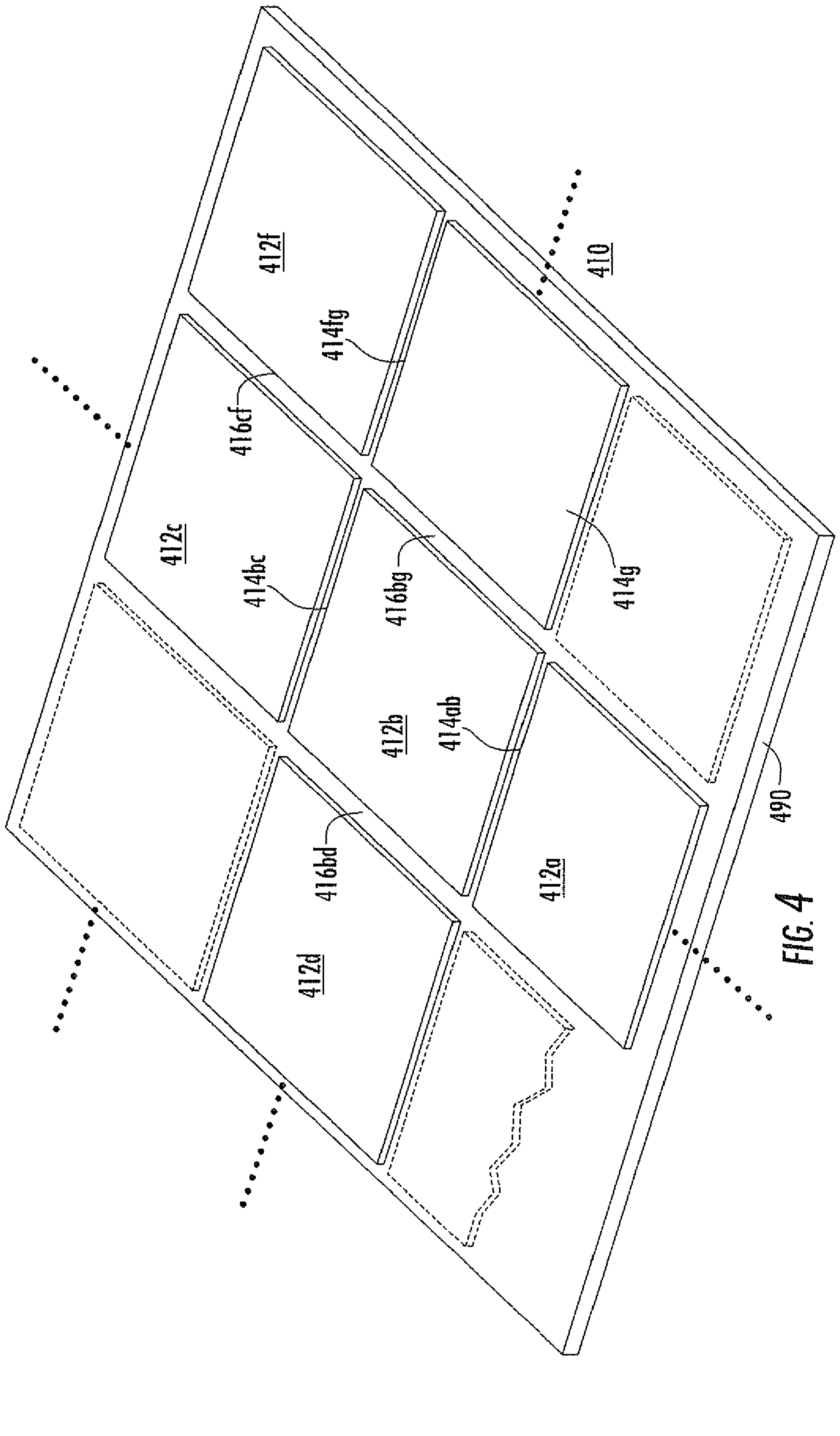
FIG. 4 is a simplified perspective or isometric view of a portion of an array of beamformer boards as described in U.S. patent application Ser. No. 11/856,767 filed Sep. 18, 2007 in the name of Pluymers et al., and entitled Planar Beamformer Structure.
Figure 5A:
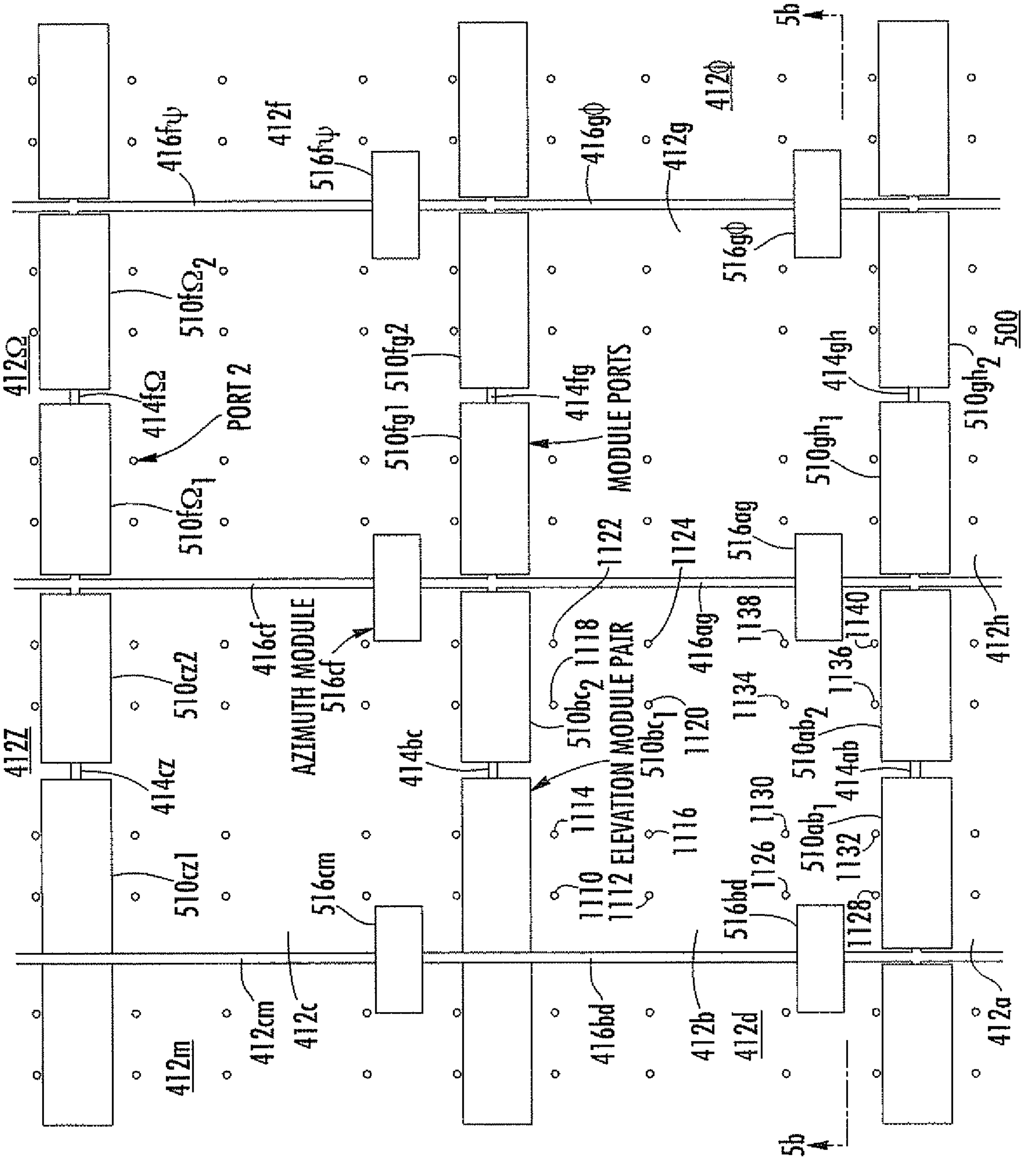
FIG. 5A is a simplified plan or top view of a portion of the array of FIG. 4, showing the locations of MMICs bridging the interstice, gap, or junction between mutually adjacent beamformer boards, and also showing the locations of transmission-line ports for a particular embodiment.
Figure 5B:
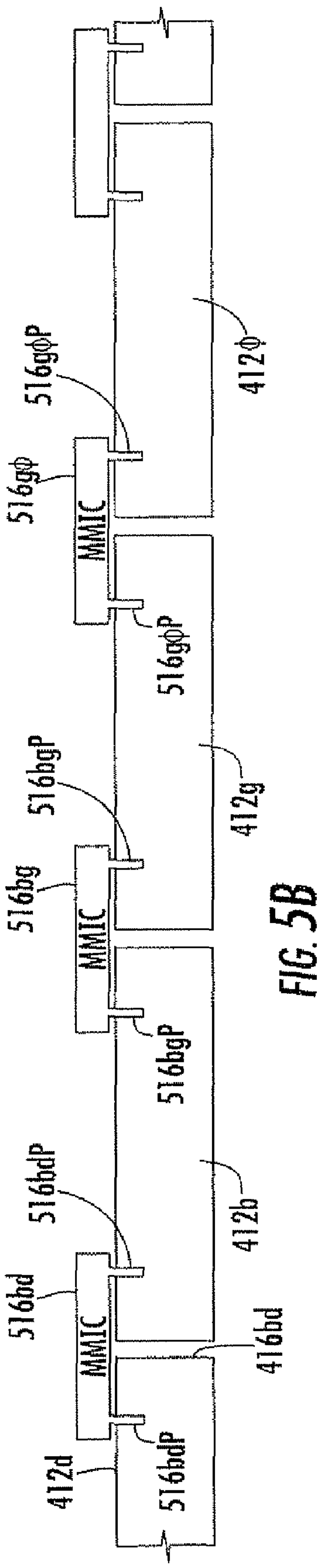
FIG. 5B is a cross-sectional view of the array of FIG. 5A taken along section line 5B-5B.
Figure 6A:
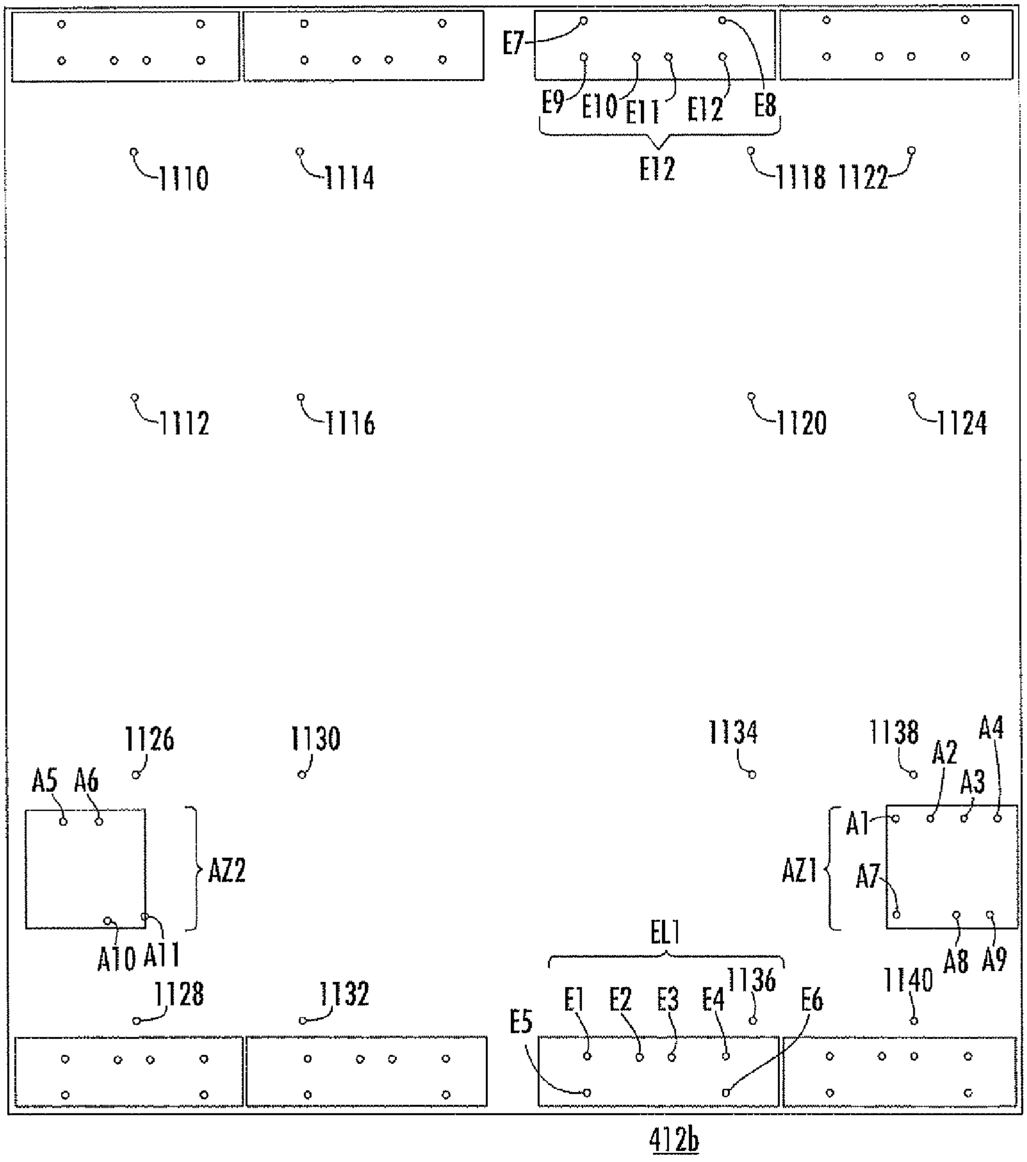
FIG. 6A is a plan view of the upper surface of one of the beamformer boards of FIG. 5A, showing certain electrically conductive pin, via, socket, or terminal connection patterns.
Figure 6B:
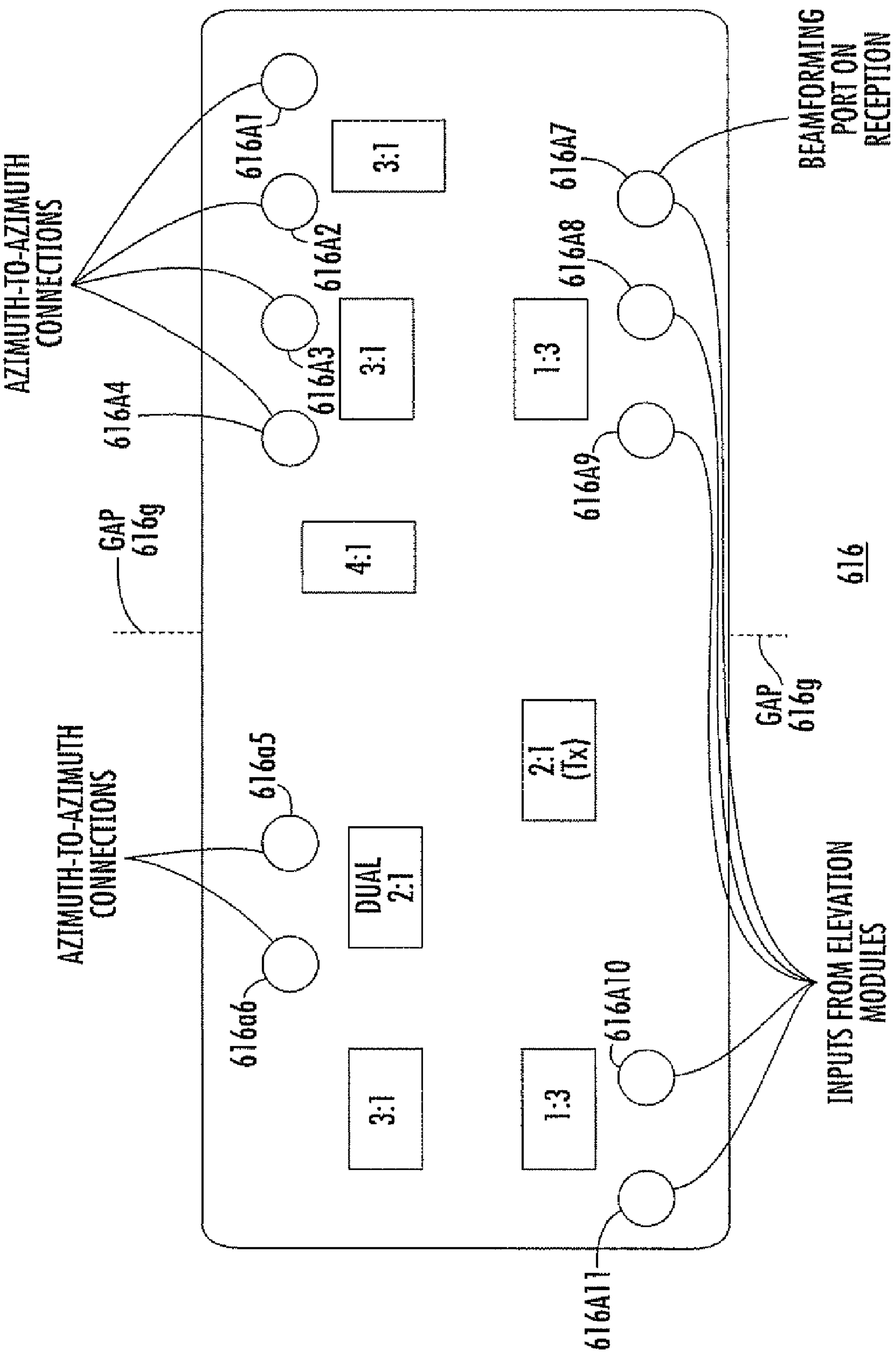
FIG. 6B is a bottom view of the connection pattern of an azimuth MMIC useful in the arrangements of FIGS. 5A and 6A.
Figure 6C:
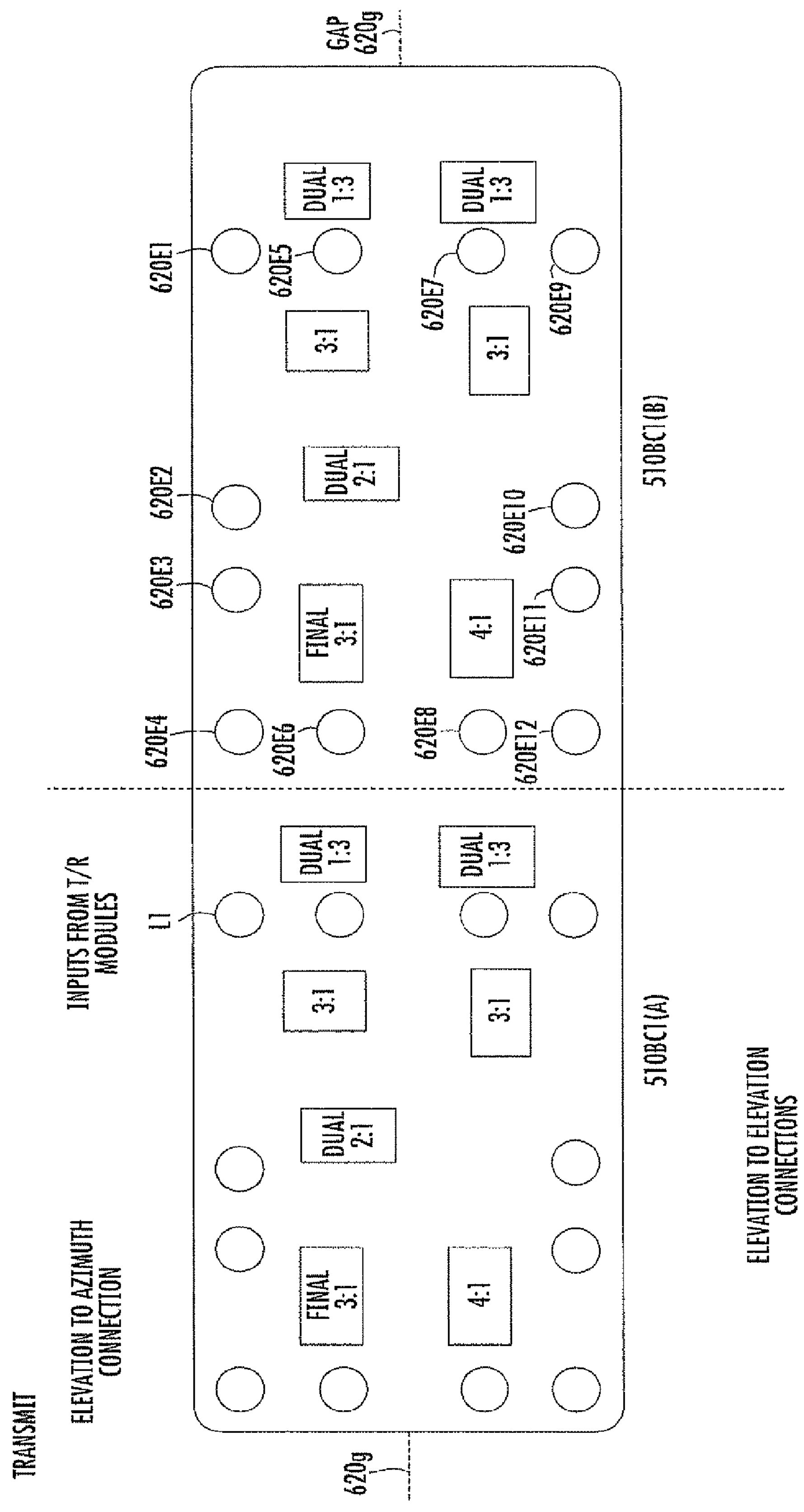
FIG. 6C is a bottom view of the connection pattern of a pair of elevation MMICs useful in the arrangements of FIGS. 5A and 6*a;*
Figure 7:
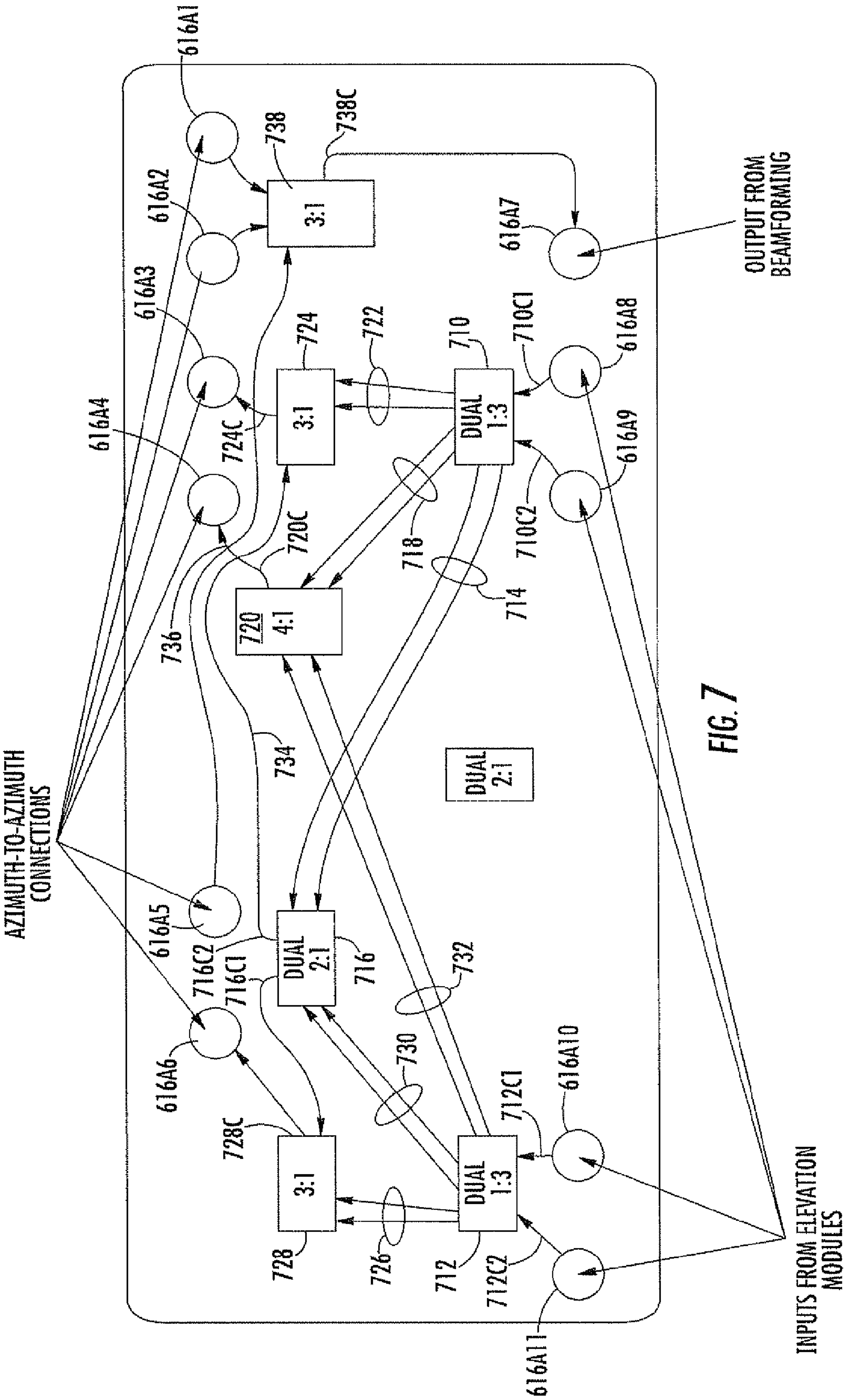
FIG. 7 is a view of the connection or pin layout of FIG. 6B, conceptually illustrating internal connections of the azimuth MMIC.
Figure 8:
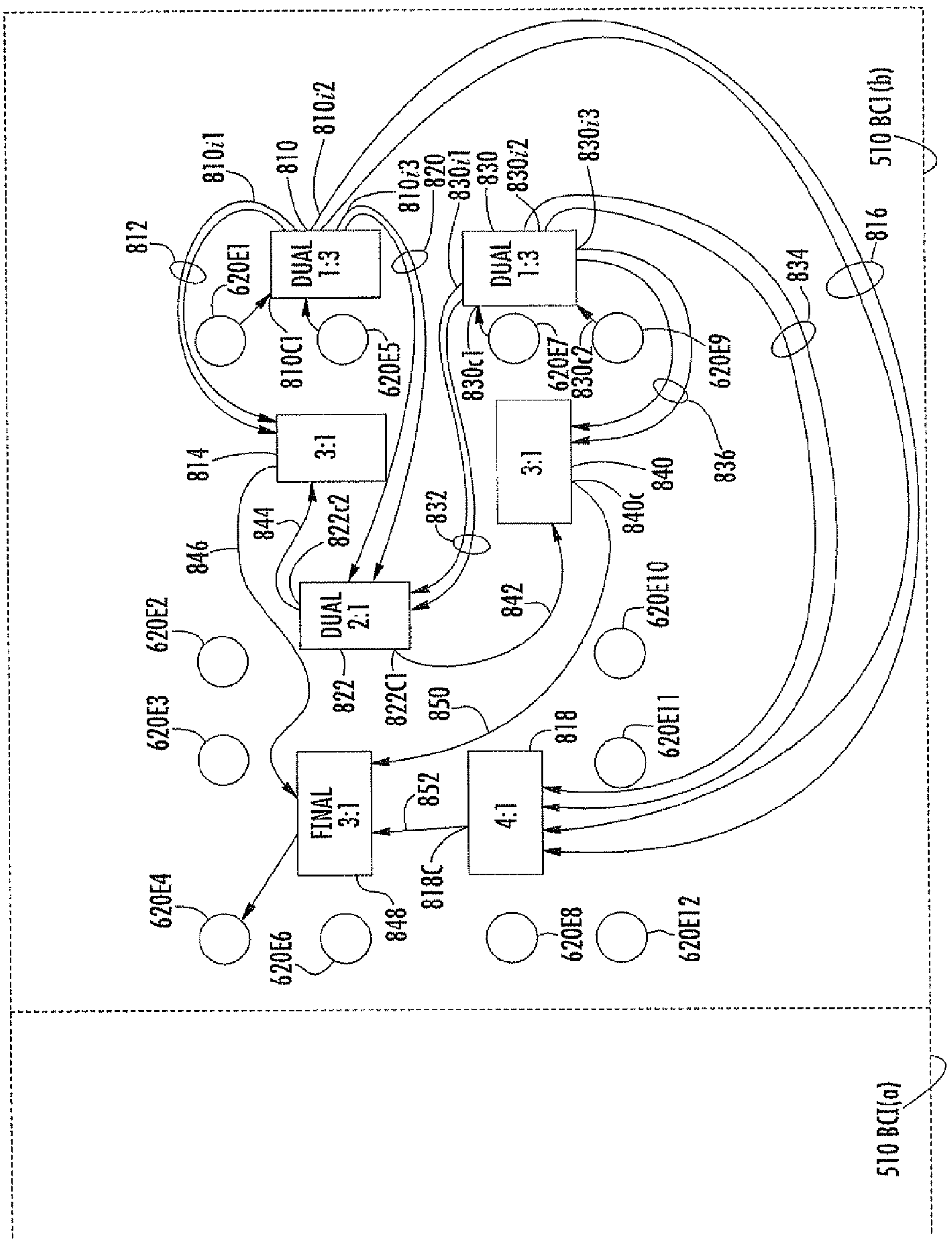
FIG. 8 is a view of the connection or pin layout of FIG. 6C, conceptually illustrating internal connections of the elevation MMIC.
Figure 9:
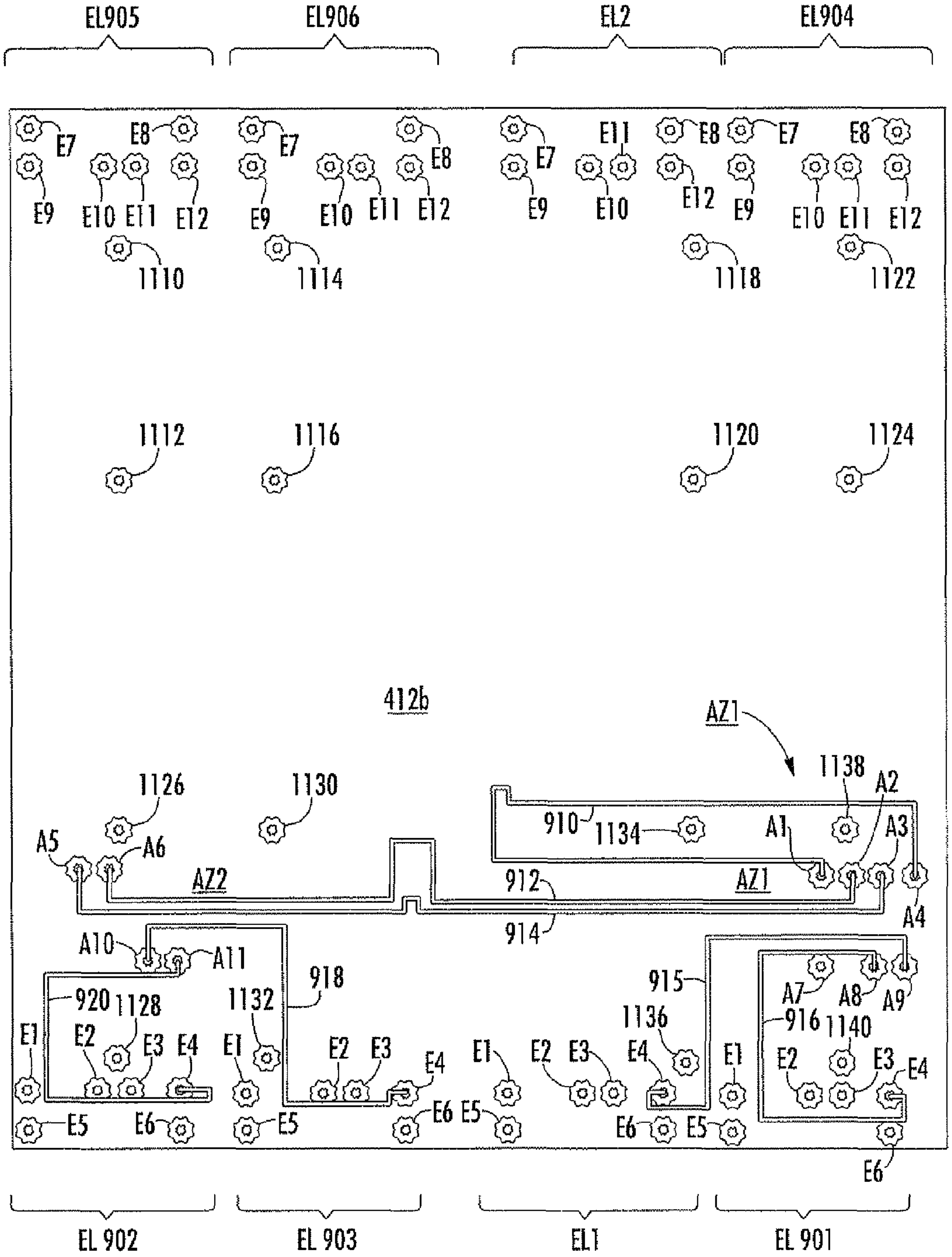
FIG. 9 is a plan view of the beamformer board of FIG. 6A, illustrating details of some of the internal connections of the beamformer board.
Figure 10:
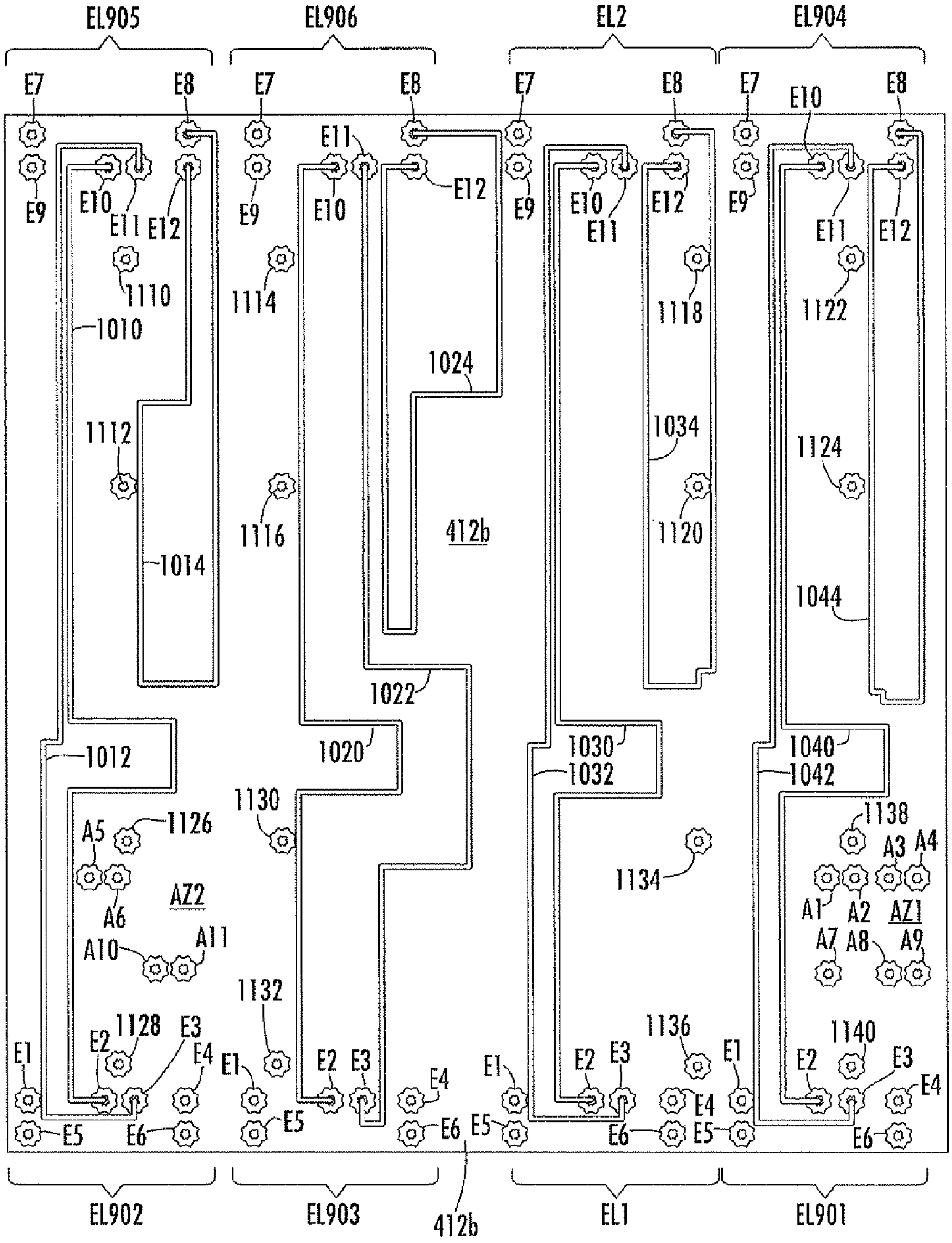
FIG. 10 is a plan view of the beamformer board of FIG. 6A, illustrating details of additional internal connections of the beamformer board, which may be viewed as being in a different layer of the beamformer board than the connections of FIG. 9.
Figure 11:
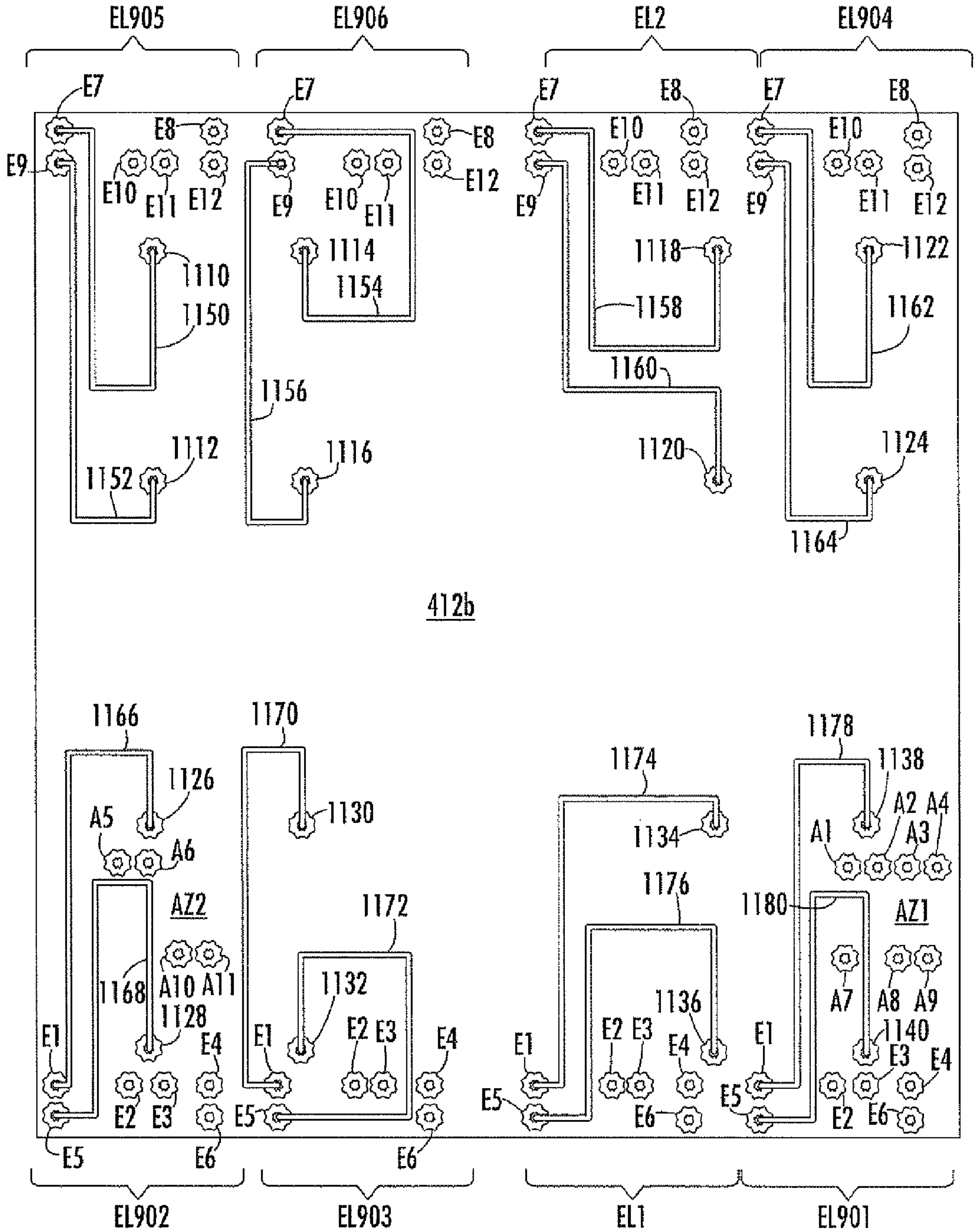
FIG. 11 is a plan view of the beamformer board of FIG. 6A, illustrating details of additional internal connections of the beamformer board, which may be viewed as being in a different layer of the beamformer board than the connections of FIGS. 9 and 10.
Figure 12:
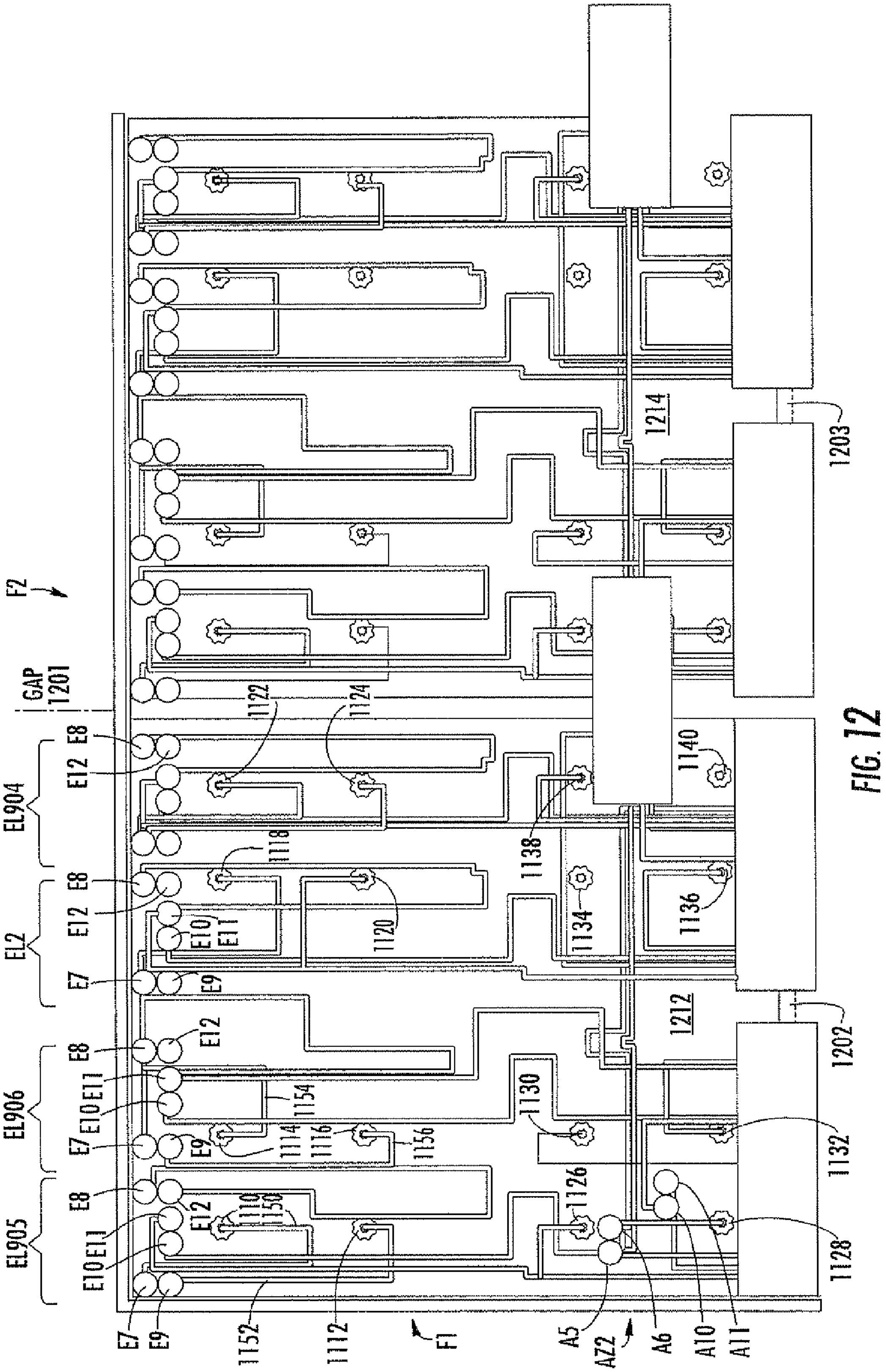
FIG. 12 is a plan view of two beamformer boards located at a corner of the array as described by Pluymers et al., showing locations of at least some terminations.
Figure 13:
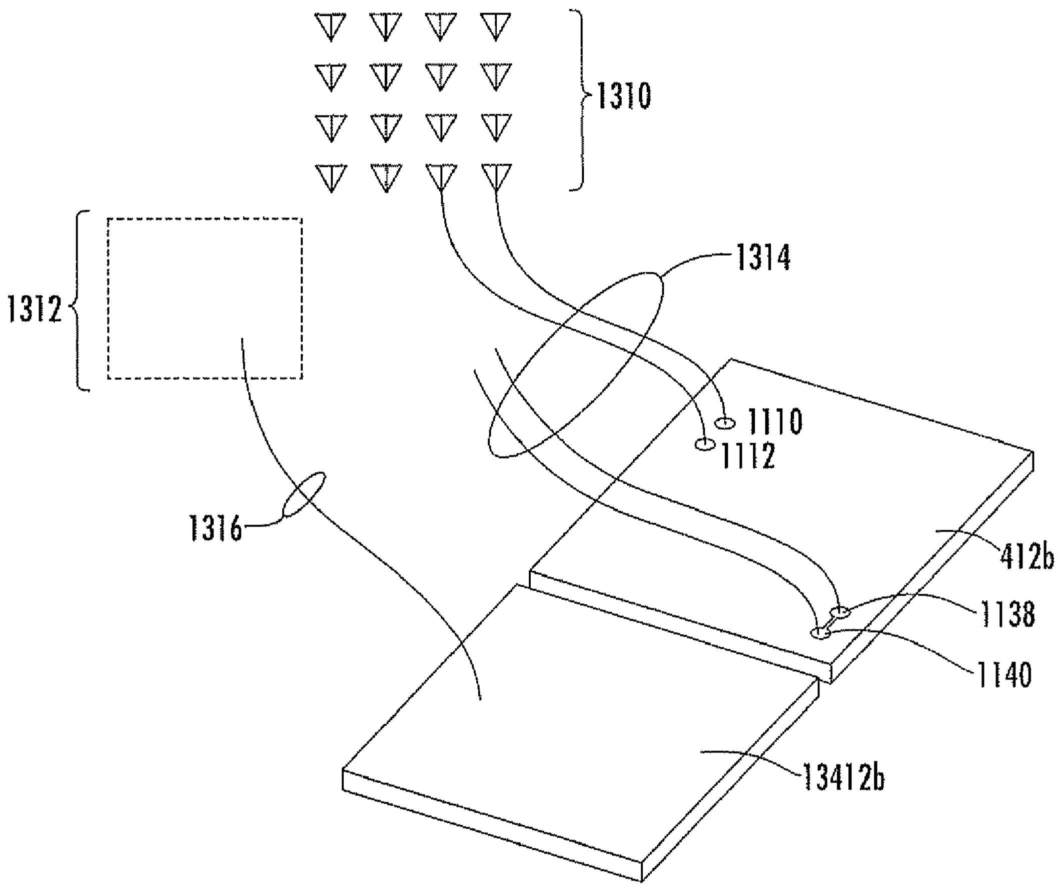
FIG. 13 is a representation of two beamformer boards connected to an antenna subarray as described by Pluymers et al.
Figure 14A:
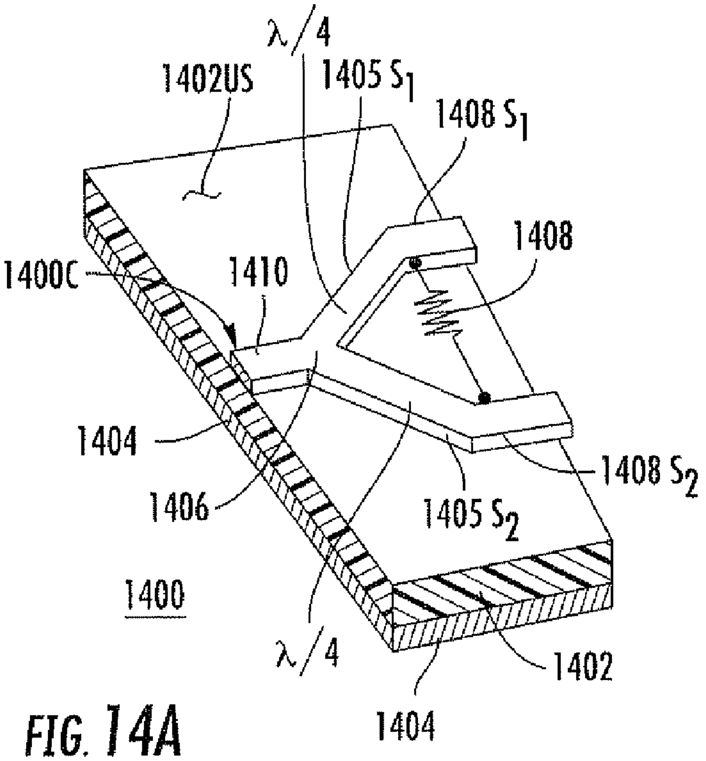
FIG. 14A is a simplified notional representation of a distributed Wilkinson equal power divider/combiner.

FIG. 14A represents a Wilkinson power divider/combiner 1400 including a dielectric substrate 1402 defining a visible broad upper surface 1402U9 and also defining a broad lower surface (not visible in FIG. 14A) which supports (overlies) an electrically conductive ground plane 1404. A strip conductor 1410 defines a common port 1400C for the divider/combiner 1400. Two separate or independent strip conductors 1405S1 and 1405S2 diverge from a junction point 1406. At a location remote from the junction point 1406 and adjacent combiner/divider output ports 1408S1 and 1408S2, an isolation resistor 1409 connects the diverged separate conductors 1405S1 and 1405S2. Further strip conductor portions 1410*a* and 1420*b* extend from the diverged ends of strip conductors 1405S1 and 1405S2 to output ports, which are arbitrarily designated as 1408S1 and 1408S2. Those skilled in the art know that, if the impedance presented to port 1400C is designated $Z_0$, the length of each of the separate strip conductors 1405S1 and 1405S2 should be one-quarter wavelength ($\lambda/4$), and the characteristic or surge impedance of each of the separate strip conductors 1405S1 and 1405S2 should be $\sqrt{2}Z_0$ in order to minimize reflective power losses. Under such length and impedance conditions, and with the ports 1408S1 and 1408S2 terminated in loads having impedance of $Z_0$, and equal power will be applied to the loads. The value of resistor 1409 is ordinarily selected to be 2 $Z_0$ in order to attenuate any reflections which might occur due to mismatch at separate output ports 1408S1 or 1408S2. The arrangement of FIG. 14A divides power equally between the separate or output ports.

Figure 14B:
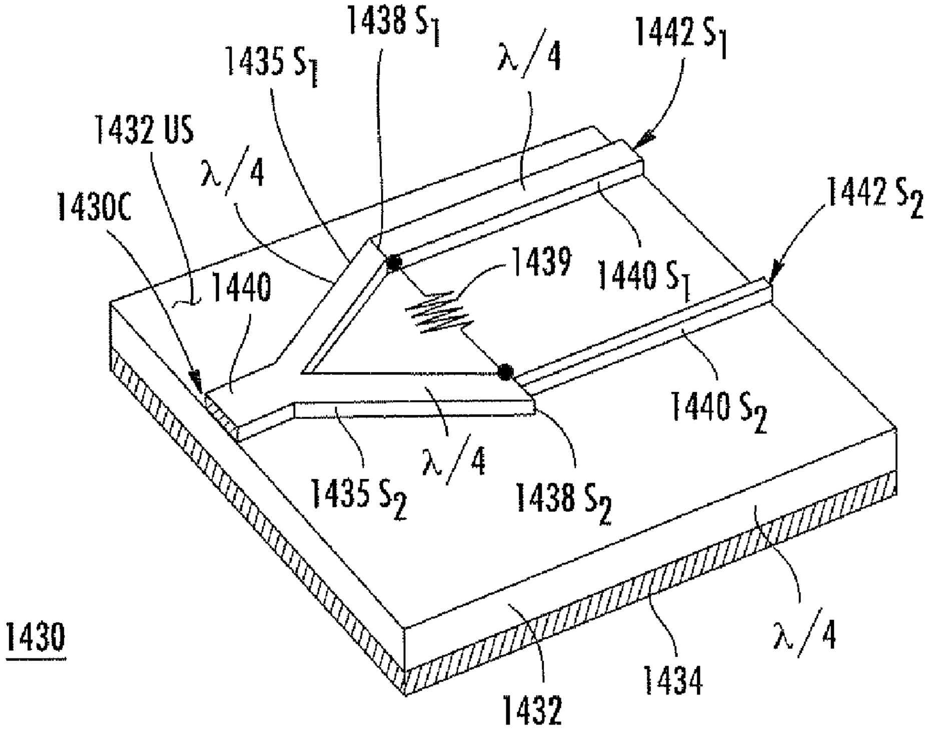
FIG. 14B represents an unequal power divider/combiner.

FIG. 14B is similar to FIG. 14A, but represents a power divider/combiner 1430 having unequal power division. In FIG. 14B, divider/combiner 1430 includes a common port 1430C, a strip conductor 1440 extending from the common port to a junction or branching point 1436. At junction point 1436, two separate strip conductors 1435S1 and 1435S2 diverge. Strip conductors 1435S1 and 1435S2 have different characteristic impedances, so as to effect unequal distribution of the applied power between or among the output ports 1438S1 and 1438S2. The need for unequal power distribution has the result of affecting the impedances at the various output ports 1438S1 and 1438S2. Consequently, additional impedance-matching sections are provided, in the form of $\lambda/4$ strip conductors 1440S1 and 1440S2. The impedances of the strip conductors and the resistance of the isolation resistor 1439 are selected in known fashion, depending upon the characteristic impedances and the power division ratio.

Figure 15:
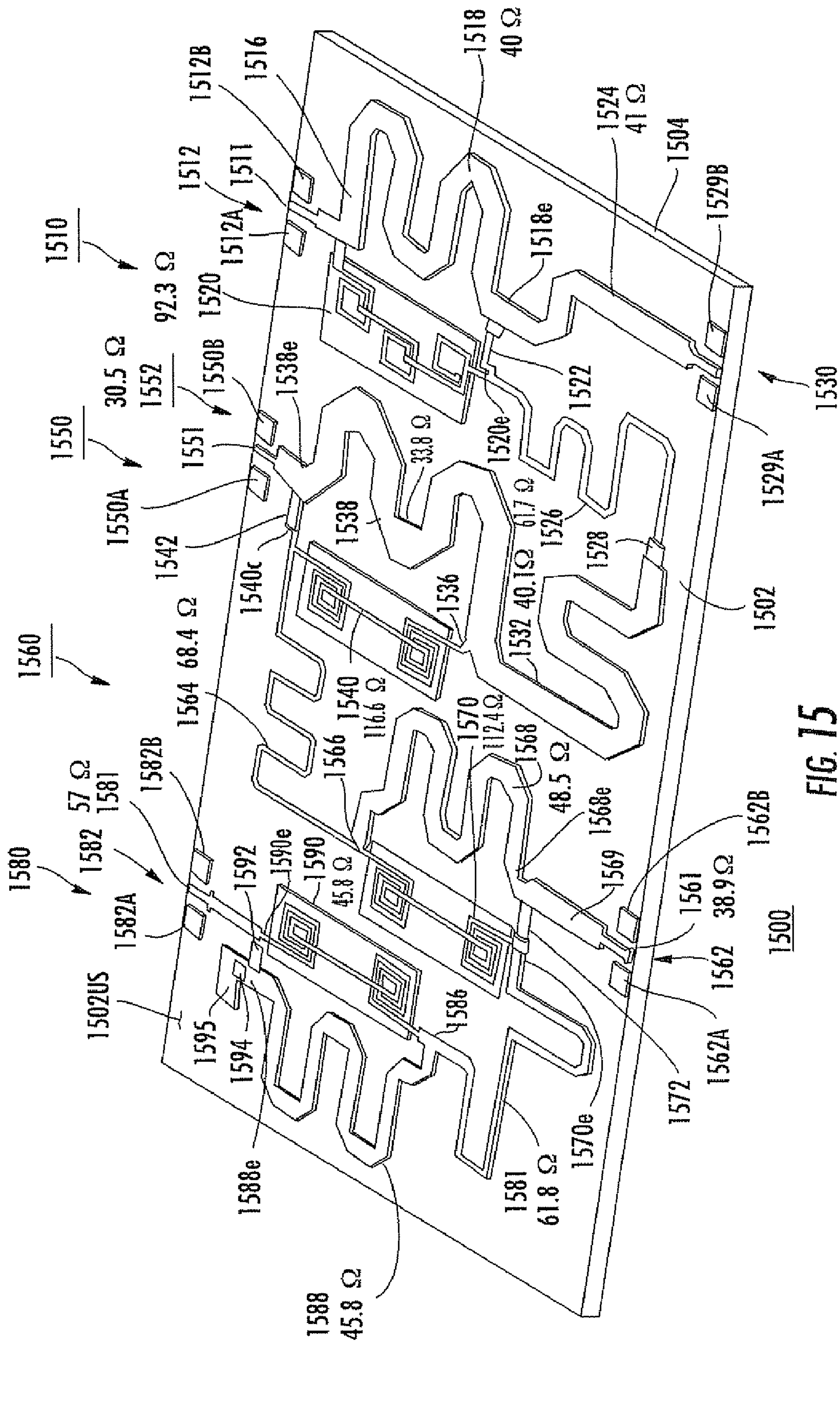
FIG. 15 is a representation of a MMIC 1:4 power divider/combiner in which strip conductors lie on the surface of a substrate according to an aspect of the invention.

FIG. 15 is a perspective or isometric view of the upper side of a monolithic microwave integrated circuit (MMIC) 1500 which may be used as part of a beamformer according to an aspect of the invention. In FIG. 15, a substrate 1502 defines a broad upper surface 1502US. A broad lower surface (not visible in FIG. 15) bears a ground plane 1504. The upper surface 1502US bears a plurality of electrically conductive portions, which may be metallizations. The particular MMIC of FIG. 15 is an elevation 4:1 tapered divider/combiner. A first unequal Wilkinson power divider/combiner is designated 1510, and includes metallizations defining an RF input port 1512. Port 1512 is a "transition" port which defines a boundary between "on-MMIC" portions and "off-MMIC" portions. Port 1512 is defined by a strip conductor segment 1511 and two adjacent ground metallizations 1512A and 1512B, and other MMIC ports are similarly defined by a strip conductor in conjunction with a pair of adjacent ground metallizations. Strip conductor 1511 extends from port 1512 to a diverging junction 1516. Strip conductor segment 1511 in conjunction with an off-MMIC or "outboard" conductor (not illustrated in FIG. 15) provides a quarter wave impedance transformer of 38.5 ohm characteristic impedance to match the diverging junction 1516 to a 50-ohm (50Ω) source impedance of the outboard conductor. Two strip conductors or transmission lines meet at junction 1516, namely capacitive or low-impedance line 1518 of 40 ohm characteristic impedance and inductive or high-impedance line 1520 of 92.3 ohm characteristic impedance. Line 1520 is defined to include three loops, which add inductance in series with the line. An isolation resistor 1522 makes contact with the output ends 1518*e* and 1520*e* of lines 1518 and 1520, respectively. As so far described, unbalanced divider/combiner 1510 provides unbalanced division of power between input port 1512 and output ends 1518*e* and 1520*e*, but may not provide the impedances at its ports required to reduce reflections. A further portion 1524 of strip conductor provides for part of a quarter-wavelength (λ/4) impedance transformation of 41 ohm characteristic impedance from port 1518*e* to an off-MMIC location outboard from transition port 1530 of MMIC 1500. A further portion 1526 of strip conductor provides for full λ/4 impedance transformation from end 1520*e* to a junction 1528. Transmission line 1526 is of 61.7 ohm characteristic impedance to match the 50 ohm sink impedance at junction 1528.

A second unequal Wilkinson power divider/combiner is designated 1550 on MMIC 1500 of FIG. 15, and includes metallization 1532 defining an 40.1 ohm characteristic impedance λ/4 impedance transformation extending from junction 1528 to a diverging junction 1536. Two strip conductors or transmission lines meet at junction 1536, namely capacitive or low-impedance line 1538 of 33.3 ohm characteristic impedance and inductive or high-impedance line 1540 of 116.6 ohm characteristic impedance. Line 1540 is defined to include two loops, which add inductance in series with the line. An isolation resistor 1542 makes contact with the output ends 1538*e* and 1540*e* of lines 1538 and 1540, respectively. As so far described, unbalanced divider/combiner 1550 provides unbalanced division of power between input port 1528 and output ends 1538*e* and 1540*e*, but may not provide the impedances at its ports required to reduce reflections. Transition or output port 1552 is defined by a strip conductor segment 1551 and two adjacent ground metallization 1550A and 1550B. Segment 1551 in conjunction with an outboard conductor provides a quarter wave impedance transformer of 30.1 ohm characteristic impedance to match to a sink impedance of 40.4 ohms. A further portion 1564 of strip conductor provides for full λ/4 impedance transformation from end 1540*e* to a junction 1566. Transmission line 1564 is of 68.4 ohm characteristic impedance.

A third unequal Wilkinson power divider/combiner is designated 1560 on MMIC 1500 of FIG. 15. Two strip conductors or transmission lines meet at junction 1566, namely capacitive or low-impedance line 1568 of 48.5 ohm characteristic impedance and inductive or high-impedance line 1570 of 112.4 ohm characteristic impedance. Line 1570 is defined to include two loops, which add inductance in series with the line. An isolation resistor 1572 makes contact with the output ends 1568*e* and 1570*e* of lines 1568 and 1570, respectively. As so far described, unbalanced divider/combiner 1560 provides unbalanced division of power between input port 1566 and output ends 1568*e* and 1570*e*, but may not provide the impedances at its ports required to reduce reflections. Transition or output port 1562 is defined by a strip conductor segment 1561 and two adjacent ground metallization 1562A and 1562B. Segment 1561 in conjunction with an outboard conductor (not illustrated in FIG. 15) provides a quarter wave impedance transformer of 38.9 ohm characteristic impedance to match to a sink impedance of 50 ohms. A further portion 1581 of strip conductor provides for full λ/4 impedance transformation from end 1570*e* of conductor 1570 to a junction 1586. Transmission line 1581 is of 61.7 ohm characteristic impedance.

A fourth unequal Wilkinson power divider/combiner of MMIC 1500 of FIG. 15 is designated 1580. Two strip conductors or transmission lines meet at junction 1586, namely capacitive or low-impedance line 1588 of 45.8 ohm characteristic impedance and inductive or high-impedance line 1590 of 122.5 ohm characteristic impedance. Line 1590 is defined to include two loops, which add inductance in series with the line. An isolation resistor 1592 makes contact with the output ends 1588*e* and 1590*e* of lines 1588 and 1590, respectively. As so far described, unbalanced divider/combiner 1580 provides unbalanced division of power between input port 1586 and output ends 1588*e* and 1590*e*, but may not provide the impedances at its ports required to reduce reflections. Output port 1582 is defined by a strip conductor segment 1581 and two adjacent ground metallization 1582A and 1582B. Segment 1581 in conjunction with an outboard conductor (not illustrated in FIG. 15) provides a quarter wave impedance transformer of 57 ohm characteristic impedance to match to a sink impedance of 40.5 ohms. A resistor 1594 in conjunction with grounding vias 1595 provide a 30 ohm termination or sink impedance to minimize reflections at junction 1588*e*.

Figure 16A:
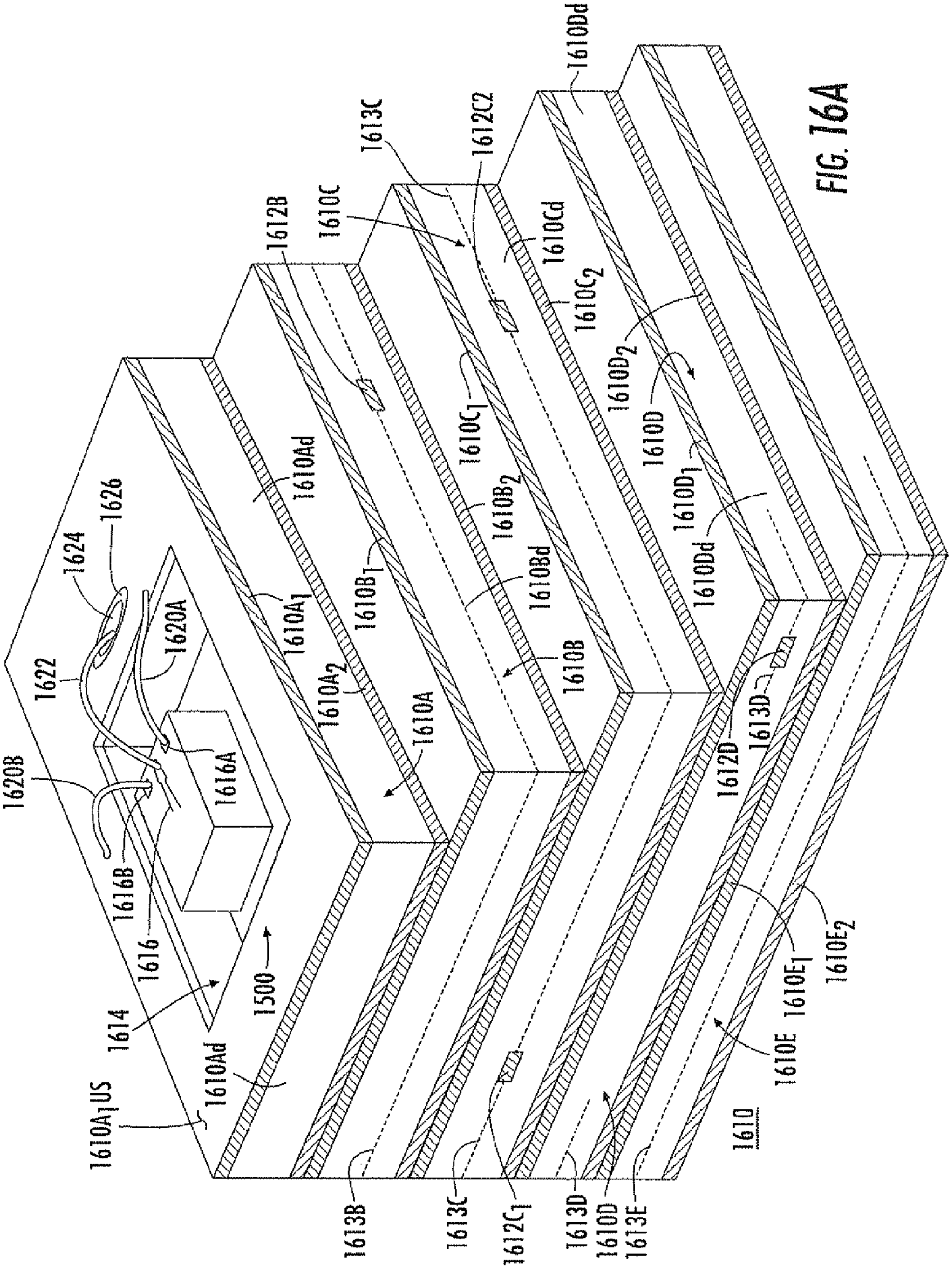
FIG. 16A is a simplified cross-sectional perspective or isometric view of a layered stripline structure.

FIG. 16A is a simplified notional perspective or isometric representation, partially cut away to reveal some interior details, of a portion of a MMIC such as that of FIG. 15 mounted on a portion of a multiple-layer structure 1610. In FIG. 16A, a multilayer structure 1610 includes four juxtaposed stripline substrates 1610B, 1610C, 1610D and 1610E, and a further substrate 1610A which is in the form of a microstrip layer. Each stripline structure includes, as well known in the art, a dielectric layer sandwiched between two electrically conductive ground-plane layers, with one or more strip conductors centered between the ground conductors. In FIG. 16A, a microstrip structure 1610A includes a dielectric material 1610Ad sandwiched between conductive layers 1610A1 and 1610A2. A first stripline structure 1610B includes a dielectric material 1610Bd sandwiched between conductive layers 1610B1 and 1610B2. For completeness, a second stripline structure 1610C includes a dielectric material 1610Cd sandwiched between conductive layers 1610C1 and 1610C2, a third stripline structure 1610D includes a dielectric material 1610Dd sandwiched between conductive layers 1610D1 and 1610D2, and a fourth stripline structure 1610E includes a dielectric material 1610Ed sandwiched between conductive layers 1610E1 and 1610E2. While four layers of stripline structure are illustrated, more or fewer layers may be used.

Figure 16B:
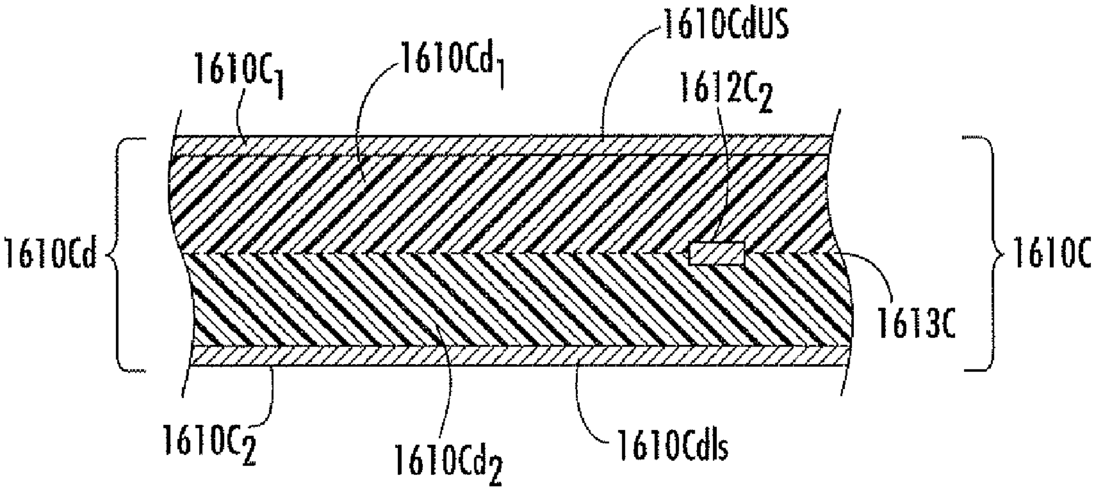
FIG. 16B is a more detailed cross-section of a representative one of the layers of the structure of FIG. 16A.

FIG. 16B is a cross-sectional side elevation view of a representative stripline layer of structure 1610 of FIG. 16A. For definiteness, the stripline layer of FIG. 16B is layer 1610C of FIG. 16A. In FIG. 16B, dielectric material 1610Cd is seen to be made up of two separate layers of dielectric, namely 1610$Cd_1$ and 1610$Cd_2$, joined at a plane 1613C. The plane 1613C is also the plane in which the strip conductors lie. A representative strip conductor is illustrated as 1612C2. Dielectric material 1610Cd defines a broad plane upper surface 1610CDUS and a broad plane lower surface 1610Cls.

In the arrangement of FIG. 16A, some additional representative strip conductors are illustrated along the sectioned edges of the structure 1610. For example, layer 1610B shows the edge 1612B of a strip conductor centered between ground layers 1610$B_1$ and 1610$B_2$, or alternatively viewed, lying in a dash-line plane 1613B equidistant from ground layers 1610$B_1$ and 1610$B_2$. Similarly, the edges of strip conductors 1612$C_1$, 1612$C_2$, and 1612D are illustrated at sectioned edges of stripline layers 1610C and 1610D, respectively, lying in planes 1613C and 1613D, respectively. To illustrate that more than one strip conductor may exist within a layer, strip conductors 1612$C_1$ and 1612$C_2$ are illustrated at sectioned edges of layer 16100, lying in plane 1613C. Stripline layer 1610E shows no cross-sections of strip conductors, suggesting that the strip conductors are contained within the structure and do not extend to the sectioned edges.

The portion of MMIC 1500 which is illustrated in FIG. 16A is mounted in a "well" 1614 formed in a microstrip layer 1612A. Microstrip layer 1612A includes a dielectric sheet 1610Ad with a conductive ground plane 1610$A_1$ on an upper side, defining an upper surface 1610$A_1$US. A further conductive ground plane 1610$A_2$ lies under dielectric sheet 1610Ad. In the region of the well 1614, the uppermost layer of structure 1610 is not, strictly speaking, a microstrip structure. Within well 1614, MMIC 1500 sits on a ground conductor, which may be either layer 1610$A_2$ or 1610$B_1$, as desired or as convenient to fabricate. Various conductors on the upper surface of MMIC 1500 are represented in FIG. 16A by strip conductor 1616 with its associated ground conductors 1616A and 1616B. As illustrated, the upper surface of MMIC 1500 and its metallizations is approximately coplanar with the upper surface 1610$A_1$US of upper ground plane 1610$A_1$. This allows convenient connections by the use of bond wires extending from the various conductors on the upper surface of MMIC 1500 to appropriate connection points associated with the upper layer 1610A of coplanar microstrip line. As illustrated in FIG. 16A, a wire-bond conductor 1620A extends from ground metallization 1616A of MMIC 1500 to a location on upper surface 1610$A_1$US of ground layer 1610$A_1$, and a wire-bond conductor 1620B extends from ground metallization 1616B to a location on upper surface 1610$A_1$US of ground layer 1610$A_1$. Strip conductor 1616, representing, together with ground metallizations 1616A and 1616E an input (or output) port of MMIC 1500, is connected by a bond wire 1622 to a connection pad 1624 defined in an isolation well 1626 defined in ground layer 1610$A_1$. Such bonding methods are well known in the art and require no further explanation.

Figure 17A:
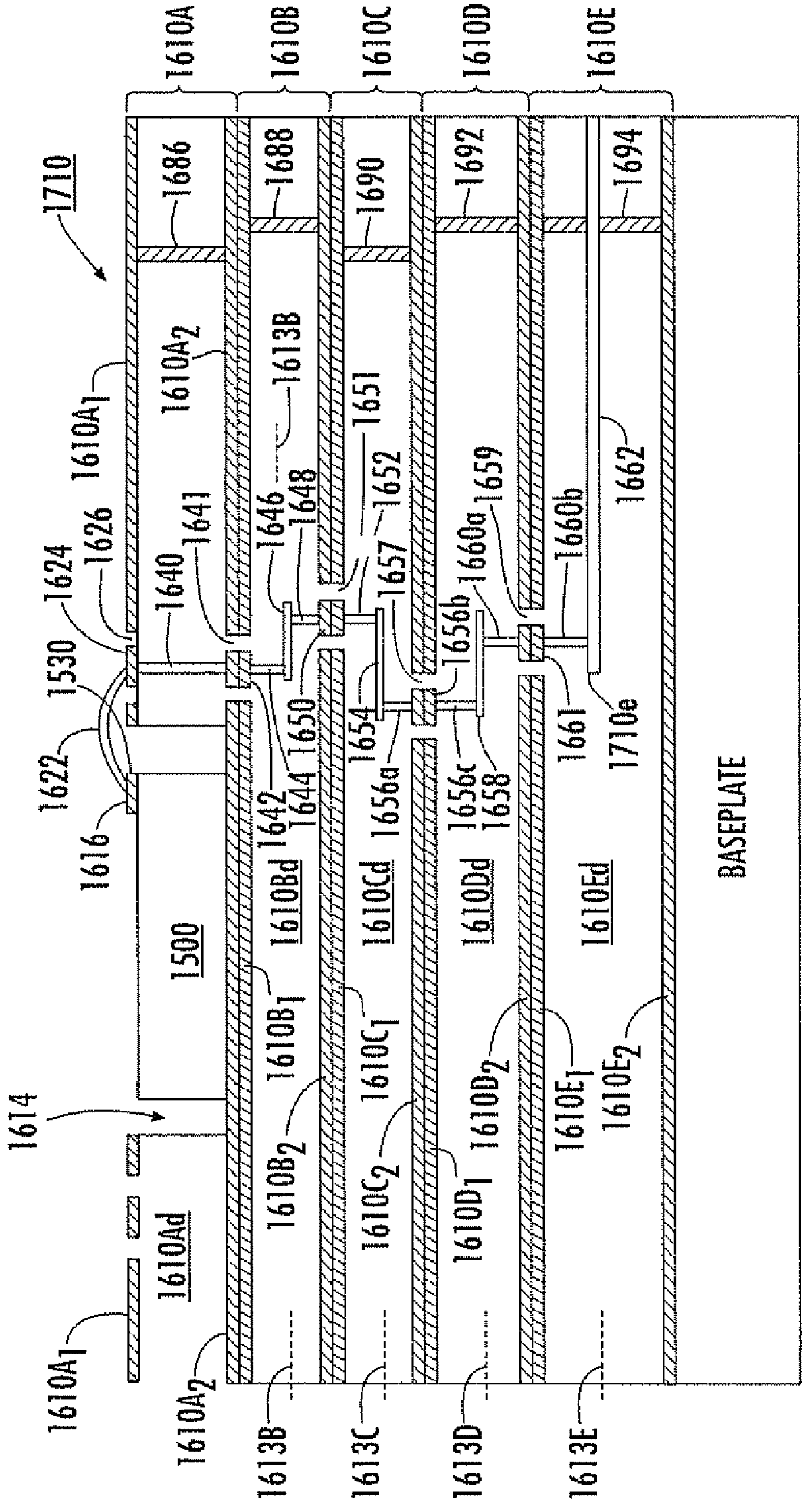
FIG. 17A is a simplified cross-sectional representation of a particular arrangement according to an aspect of the invention in which the MMIC of FIG. 15 is connected to vertical and horizontal transmission lines extending through the layers of a stripline structure similar to that of FIGS. 16A and 16B.

FIG. 17A is an elevation cross-section of a structure having the same general characteristics as FIG. 16A, showing representative vertical and horizontal transmission lines extending through the strip conductor layers, and connections between a MMIC and vertical transmission lines. In FIG. 17A, the four layers of stripline and one layer of coplanar microstrip line are designated by the same alphanumerics as in FIG. 16A. Wire bond 1622 extends from metallization 1616 on the upper surface, of MMIC 1500 to a pad 1624 defined in an isolation region or moat 1626. A through via or other conductor 1640 extends vertically downward (as seen in FIG. 17A) from pad 1624 through the dielectric material 1610Ad to a conductive "pad" 1642 defined by an isolation region or moat 1641 defined in ground layers 1610$A_2$ and 1610$B_1$. A further through via 1644 extends vertically downward from conductive pad 1642 to the left end (as seen in FIG. 17A) of a strip conductor 1646 which extends to the right along plane 1613B. A further through via 1648 extends vertically downward from the right end of strip conductor 1646 to contact a pad 1650 defined by an isolation moat 1651 in conductive ground planes 1610$B_2$ and 1610$C_1$. A further through via 1652 extends vertically downward from pad 1650 to the right end of a strip conductor 1654 lying in plane 1613C. Strip conductor 1654 extends to the left from the junction with through via 1652. At the left end of strip conductor 1654 a through via 1656*a* extends vertically downward to a conductive contact pad 1656*b* defined by an isolation "aperture" or "window" 1657 in ground conductors 1610$C_2$ and 1610$D_1$. A further through via or other conductor 1656*c* extends downward from contact pad 1656*b* to contact the left end of a further strip conductor 1658. A through via 1660*a* extends vertically downward from the right end of strip conductor 1658 to a contact pad 1661 defined by an isolation aperture 1659 in ground conductors 1610$D_2$ and 1610$E_1$. A further through via or other conductor 1660*b* extends downward from contact pad 1661 to contact the left end of a strip conductor 1662. Strip conductor 1662 extends to the right to a further port (not illustrated). The combination of the vertical transmission line segments 1624, 1640, 1642, 1644, 1646, 1648, 1650, 1652, 1654, 1656*a*, 1656*b*, 1656*c*, 1658, 1660*a*, 1661, and 1660*b* is collectively designated as vertical transmission line 1710. The lowermost end of vertical transmission line 1710 is designated 1710*e* where it makes contact with standard-impedance transmission line 1662. It should be noted that the inductance of bond wire 1622 is a significant design parameter in the off-chip or off-MMIC portion of the impedance transformation. Those skilled in the art know how to adjust the impedances of the transmission lines in the presence of the inductance of a bond wire. Thus, the vertical transmission line 1710 may be viewed as originating at transition port 1616.

The ground conductors of layer 1610 of FIG. 16A are interconnected, so as to attempt to preserve a single ground potential. This can be accomplished by electrical ground conductors extending vertically through the various dielectric layers to make ground contact at various locations throughout the structure. Of course, such interconnecting ground conductors cannot make contact with strip conductors without "shorting" the transmission line associated with the strip conductor. A representative interconnecting ground conductor is illustrated in FIG. 17A as a group of conductors 1686, 1688, 1690, 1692, and 1694. while illustrated as being mutually offset from layer to layer, the interconnecting ground conductors may be coaxial. Each interconnecting ground conductor makes contact with the ground conductor immediately above it and immediately below it. Thus, interconnecting ground conductor 1686 makes contact with ground conductor (or ground plane) 1610$A_1$ and with ground conductor 1610$A_2$, thus placing both ground conductors at the same potential. Similarly, interconnecting ground conductor 1688 makes contact with ground conductor 1610$B_1$ and with ground conductor 1610$B_2$. In the same manner, interconnecting ground conductor 1690 makes contact with ground conductor 1610$C_1$ and with ground conductor 1610$C_2$, interconnecting ground conductor 1692 makes contact with ground conductor 1610$D_1$ and with ground conductor 1610$D_2$, and interconnecting ground conductor 1694 makes contact with ground conductor 1610$E_1$ and with ground conductor 1610$E_2$. interconnecting ground conductor 1694 is illustrated as lying "behind" strip conductor 1662 in FIG. 17A so as to indicate lack of contact between interconnecting ground conductor 1694 and strip conductor 1662. Ground conductor 1610$A_2$ is in contact with ground conductor 1610$B_1$, so ground conductor 1610B1 is also at the potential of ground conductor 1610$A_1$. Similarly, ground conductor 1610$B_2$ is in contact with ground conductor 1610$C_1$, ground conductor 1610$C_2$ is in contact with ground conductor 1610$D_1$, and ground conductor 1610$D_2$ is in contact with ground conductor 1610$E_1$. Thus, all the ground planes contact each other, either directly through intimate contact, or through interconnecting ground conductors. All the ground conductors are therefore at similar or the same electrical potentials. Those skilled in the art know that in order to maintain proper characteristic impedance, the interconnecting ground conductors must be close to the vertical transmission line segments, such as segments 1640, 1644, 1648, and the like.

Figure 17B:
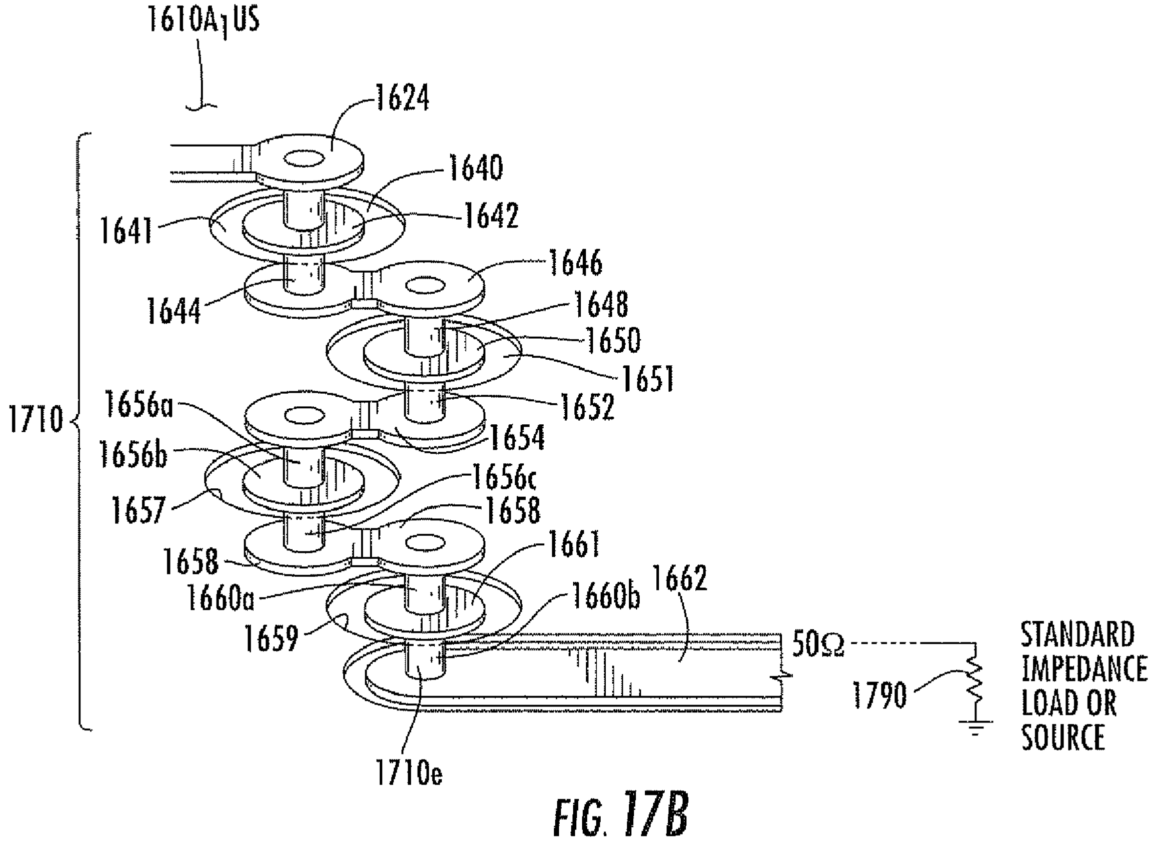
FIG. 17B is a simplified perspective or isometric phantom view of a vertical transmission line which can be used in the arrangement of FIG. 17A.

FIG. 17B is a simplified notional perspective or isometric phantom view of the combination of the vertical and horizontal transmission lines extending through the multilayer stripline structure such as that of FIG. 17A. Elements of FIG. 17B corresponding to those of FIG. 17A are designated by like reference alphanumerics. The ground conductors are illustrated only in part, sufficient to make it clear that the strip conductors do not contact the ground conductors to create a short-circuit condition. The interconnecting ground conductors are not illustrated.

Figure 18:
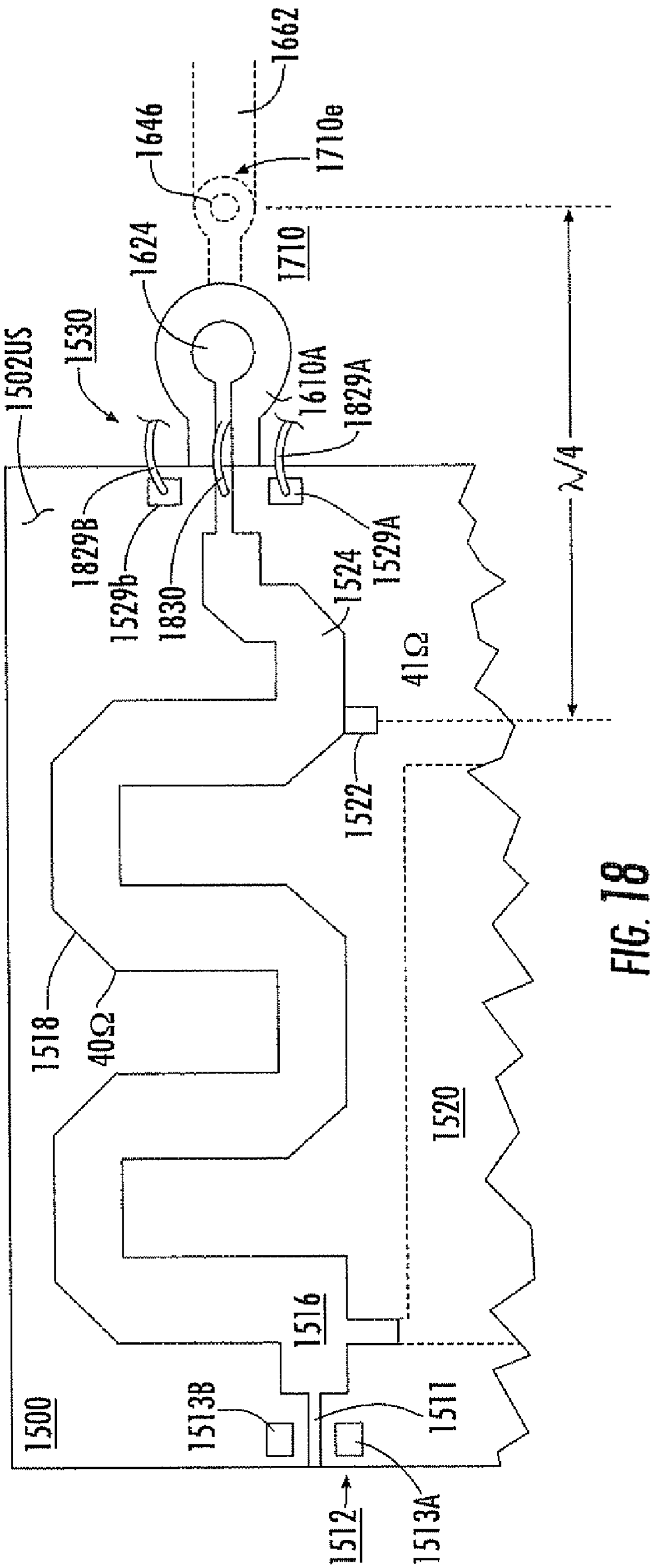
FIG. 18 is a simplified notional representation of a portion of a MMIC with strip conductors which connect to off-MMIC transmission lines according to an aspect of the invention.

FIG. 18 is a plan view of a portion of the MMIC 1500 of FIG. 15 together with a portion of the off-MMIC vertical transmission line 1710 of FIGS. 17A and 17B. In FIG. 18, an input port 1512 of MMIC 1500 includes a strip conductor 1511, which leads by way of a junction 1516 to a relatively low impedance strip conductor 1518. Strip conductor 1518 extends across the upper surface 1502US to a port 1530. Port 1530 is defined by ground metallizations 1529A and 1529B. Ground contact is made between port 1530 of the MMIC 1500 and the ground surface 1610A1 of the underlying support structure by means of bond wires 1825A and 1825B. Similarly, bond wire 1830 makes contact between an end of strip conductor 1518 and the strip conductor pad 1624, either directly or by way of an intermediary conductive strip. The contact between MMIC port 1530 and vertical transmission line 1710 in effect connects strip conductor 1518 and vertical transmission line 1710 in series, so that they constitute one entity. The lower end of the vertical transmission line 1710 makes contact with the left end of 50-ohm strip transmission line 1662, as described in conjunction with FIGS. 17A and 17B.

The impedance transformation between 50-ohm strip transmission line 1662 and junction 1522 of FIG. 18 is provided by the series combination of the strip conductor 1524 with vertical transmission line 1710. In general, as described, such transmission lines must be approximately λ/4 long in order to provide the desired transformations, and the impedance of the transmission line must be appropriately selected. In the arrangement of FIG. 18, the strip conductor 1524 has a characteristic or surge impedance of about 41 ohms, and the vertical transmission line also has a characteristic impedance of about 41 ohms. Thus, the entire transmission line including segments 1524 and 1710 has the same characteristic impedance. The advantage of the on-MMIC strip conductor in conjunction with the off-MMIC vertical transmission line can be understood by considering that, in the absence of the apportioning according to the invention, the entire length of the low-impedance transmission line 1524/1710 would have to be on the MMIC. In the case of MMIC 1500 of FIG. 15, there are several low-impedance transmission lines, namely lines 1524, 1538, and 1569 that go off-MMIC. Each of these low-impedance transmission lines take up much more surface area than the high-impedance transmission lines, and if all three were to be on-board the MMIC 1500 for their full lengths, the total size of the MMIC would undesirably be larger and therefore more costly. Thus, according to an aspect of the invention, at least some of the impedance-changing transmission lines are segmented, with portions on-board the MMIC and other portions offboard.

Figure 19:
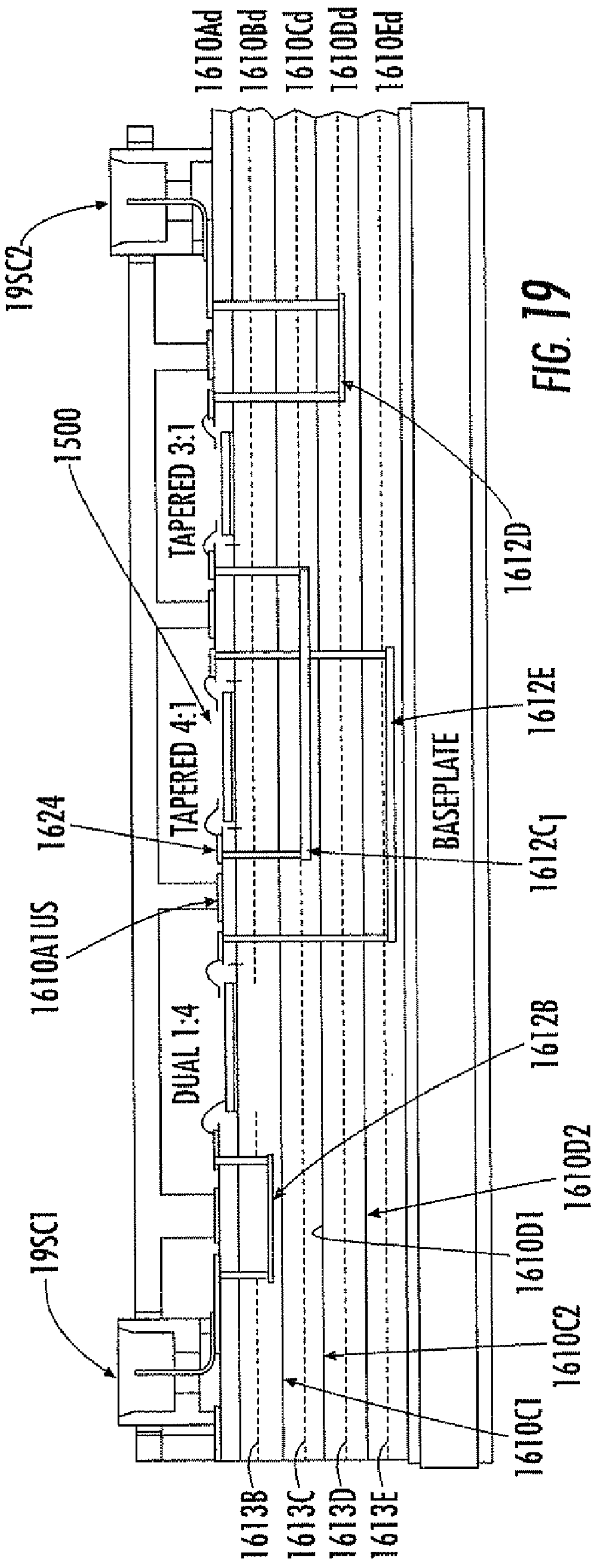
FIG. 19 is a cross-section of a stacked structure which illustrates multiple integrated circuit arrangements with different amplitude distributions.

FIG. 19 is a simplified cross-sectional representation of a structure including a multilayer board such as 1610 of FIG. 16A with a plurality of MMIC modules, arranged generally as described in conjunction with FIGS. 17A and 17B, and including surface connectors. In FIG. 19, the surface connectors are designated 19SC1 and 19SC2. FIG. 19 illustrates a strip conductor 1612E which is not shown in other FIGURES.

While the uppermost layer 1610A of stack 1610 of FIG. 16A has been described as being a microstrip layer, it could be arranged as a stripline layer, so long as no strip conductors were required to pass through the region of well 1614.

Thus, a beamformer according to an aspect of the invention includes a power divider/combiner (1510). The power divider/combiner (1510) includes a common port (1512) and first (1518*e*) and second (1520*e*) individual ports on an integrated-circuit substrate (1502), and also includes a first transmission line (1518), which may be a strip transmission line, extending from the common port (1512) to the first individual port (1518*e*) on the integrated circuit substrate (1502). The power divider/combiner (1510) also includes a second transmission line (1524, 1710) including first (1524) and second (1710) portions, the first portion (1524) of which may be in the form of a strip transmission line. The first portion (1524) of the second transmission line (1524, 1710) extends on the integrated-circuit substrate (1502) from the first individual port (1518*e*) of the power divider/combiner (1510) to a second integrated-circuit port (1530). The second portion (1710) of the second transmission line (1524, 1710) extends from the second integrated-circuit (1530) port vertically through plural layers (1610B, 1610C, . . . ) of an underlying printed-circuit board stack (1610) to a third port (1710*e*). In an embodiment of such a beamformer, the characteristic impedances of the first and second portions of the second transmission line, and their combined length, are selected to match the impedance at the individual port to a standard impedance at the third port. The standard impedance at the third port may be 50 ohms.

A beamformer (10) according to an aspect of the invention is for coupling antenna (14) ports to at least one common port (50, 54). The beamformer (10) comprises a plurality (four) of stripline printed-circuit boards (1610). At least some of the printed-circuit boards (1610B, . . . 1610E) include first (1610$Cd_1$) and second (1610$Cd_2$) juxtaposed dielectric sheets, and a strip conductor (1612$C_2$) lying therebetween. The juxtaposed dielectric sheets (1610$Cd_1$, 1610$Cd_2$) of each of the stripline printed-circuit boards (1610B, 1610C, . . . ) define broad first (1610CdUS) and second (1610Cdls) surfaces. The juxtaposed dielectric sheets of each of the stripline printed-circuit boards (1610B, 16100, . . . ) also include or are associated with electrically conductive ground conductors (1610C1, 1610C2) lying on the broad first (1610CdUS) and second (1610Cdls) surfaces of the juxtaposed dielectric sheets (1610$C_1$, 1610$Cd_2$). The plurality (four) of stripline printed-circuit boards (1610B, . . . , 1610E) are stacked with the electrically conductive ground conductors on the first broad side (1610CdUS) of one of the boards being in mechanical (and therefore electrical) contact with the electrically conductive ground conductors on the second broad side (1610Cdls) of another one of the boards, to thereby define a layered stack structure (1610). A plurality of power divider/combiners (1510) each include a common port (1512), at least first (1518*e*) and second (1520*e*) individual ports, and resistances (1522) interconnecting the individual ports (1528*e*, 1520*e*). At least one of the power divider/combiners (1510) includes first (1518) and second (1520) strip transmission lines extending from the common port (1512) to the first (1518*e*) and second (1520*e*) individual ports, respectively, on an integrated-circuit substrate (1502). The integrated-circuit substrate (1502) is mounted on a ground conductor (1610A2 or 1610B1) of the stack (1610). The first transmission line (1518) has a lower characteristic impedance (40 ohms) than the second transmission line (92.3 ohms). A further transmission line (1524, 1710) is coupled to the first individual (1518*e*) port of the one of the power divider/combiners (1510). The further transmission line (1524, 1710) comprises first (1524) and second (1710) portions. The first (1524) and second (1710) portions are connected end-to-end to define a single long further transmission line. The first portion (1524) of the further transmission line (1524, 1710) extends on the integrated-circuit substrate from the first individual port (1518*e*) to a transition port (1530) of the integrated-circuit dielectric substrate (1502). The transition port (1530) defines a boundary between on- and off-integrated-circuit-substrate. The second portion (1710) of the further transmission line (1524, 1710) extends from the transition port (1530) vertically through at least one layer of the stacked printed-circuit boards (1610) to a further standard-impedance port (1710*e*). The electrical length of the further transmission line (1524, 1710) is selected to be one-quarter wavelength at the frequency of operation of the beamformer (10). A further standard-impedance (50Ω) transmission line (1662) extends from the standard-impedance port (1710*e*) to a standard-impedance (50Ω) load or source (1790). In a particular embodiment, the second portion (1710) of the further transmission line (1524, 1710) extends through at least three layers of the layered structure.

A beamformer (10) according to an aspect of the invention is for coupling antenna (14) ports to at least one common port (50, 54). The beamformer (10) comprises a plurality (four) of stripline printed-circuit boards (1610B, 1610C, 1610D, 1610E) and (one) co-planar microstrip printed-circuit board (1610A). Each of the stripline printed-circuit boards (1610B, 1610C, . . . , 1610E) includes first (1610$Cd_1$) and second (1610$Cd_2$) juxtaposed dielectric sheets, at least some of which include a strip conductor (1612$C_2$) lying therebetween. The juxtaposed dielectric sheets (1610$Cd_1$, 1610$Cd_2$) of each of the stripline printed-circuit boards (1610B, 1610C, . . . ) define a dielectric layer (1610C) defining broad first (1610CdUS) and second (1610Cdls) surfaces, and also include electrically conductive grounds or ground conductors (1610C1, 1610C2) lying on the broad first (1610CdUS) and second (1610Cdls) surfaces of the dielectric layer (1610C). The co-planar microstrip printed-circuit board (1610A) includes a single dielectric sheet (1610A) with both the conductor (1624) and the co-planar ground (1610$A_1$) located on the broad side top surface of the dielectric sheet (1610$A_1$US) and the microstrip ground (1610$A_2$) located on the broad side bottom surface of the dielectric sheet. The plurality (five) of printed-circuit boards (1610A, 1610B, . . . , 1610E) are stacked with the first broad side (1610CdUS) of one of the boards being in mechanical contact with the second broad side (1610Cdls) of another one of the boards, to thereby define a layered structure (1610). The beamformer (10) also includes a plurality of power divider/combiners (1400, 1430). Each power divider/combiner includes a common port (1400C, 1430C), at least first (1408S1: 1438S1) and second (1408S2: 1438S2) individual ports, and resistances (1408: 1439) interconnecting the individual ports. At least one of the power divider/combiners (1400, 1430) includes a quarter wavelength impedance transforming transmission line (1518) extending from the common port (1512) to the first individual port (1518*e*). At least portions of the first (1518) and second (1520) transmission lines are in the form of integrated strip conductors overlying an integrated-circuit dielectric substrate (1502), which in turn overlies and is affixed to an electrically conductive ground plane (1504). The first transmission line has a lower transmission line (92.3 ohms). The electrically conductive ground plane (1504) of the integrated circuit is mechanically affixed and electrically connected to the ground of the stack. The beamformer (10) comprises a further transmission line (1524, 1710) coupled to the first individual (1518*e*) port of the one of the power divider/combiners (1400, 1430). The further transmission line (1524, 1710) comprises first (1524) and second (1710) portions. The first portion (1524) of the further transmission line (1524, 1710) extends from the first individual port (1518*e*) to a transition port (1530) of the integrated-circuit dielectric substrate (1502), and overlies the integrated-circuit dielectric substrate (1502). The second portion (1710) of the further transmission line (1524, 1710) extends from the transition port (1530) vertically through at least one layer of the juxtaposed printed-circuit boards (1610) to a further standard-impedance port (1710*e*). The length of the further transmission line (1524, 1710) is selected to be one-quarter wavelength (λ/4) at the frequency of operation of the beamformer (10). Those skilled in the art know that the length is selected to be one-quarter wavelength at a frequency near the center of the operating bandwidth, or at least within the operating bandwidth. A further standard-impedance (50Ω) transmission line (1662) extends from the standard-impedance port (1710*e*) to a standard-impedance (50Ω) load or source (1790). In a particular embodiment of the beamformer, the second portion (1710) of the further transmission line (1524, 1710) extends through at least three layers of the layered structure.

What is claimed is:

1. A beamformer, comprising:

a power divider/combiner including a common port and first and second individual ports on an integrated-circuit substrate, and a first transmission line extending from the common port to the first individual port on said integrated circuit substrate;

a second transmission line including first and second portions, said first portion extending on said integrated-circuit substrate from said first individual port of said power divider/combiner to a second integrated-circuit port; and said second portion of said second transmission line extending from said second integrated-circuit port vertically through plural layers of an underlying printed-circuit board stack to a third port;

wherein said first transmission line has a lower characteristic impedance than said second transmission line.

2. A beamformer according to claim 1, wherein the characteristic impedances of the first and second portions of the second transmission line, and their combined length, are selected to match the impedance at the first individual port to a standard impedance at said third port.

3. A beamformer according to claim 1, wherein the power divider/combiner has an unequal power division.

4. A beamformer according to claim 1, wherein resistances interconnect said first and second individual ports of said power divider/combiner.

5. A beamformer according to claim 1, wherein said first and second transmission lines are mounted on an integrated-circuit substrate, which integrated-circuit substrate is affixed to an electrically conductive ground plane.

6. A beamformer for coupling antenna ports to at least one common port, said beamformer comprising:

a plurality of stripline printed-circuit boards defining a layered stack structure;

a plurality of power divider/combiners each including a common port, at least first and second individual ports, and resistances interconnecting said individual ports, at least one of said plurality of power divider/combiners including first and second transmission lines extending from said common port to said first and second individual ports, respectively, on an integrated-circuit dielectric substrate, said integrated-circuit dielectric substrate being mounted on a ground plane of said layer stack structure, said first transmission line having a lower characteristic impedance than said second transmission line; and a further transmission line coupled to said first individual port of said at least one of said plurality of power divider/combiners, said further transmission line extending on said integrated-circuit dielectric substrate from said first individual port to a transition port of said integrated circuit dielectric substrate, the electrical length of said further transmission line being selected to be one-quarter wavelength at the frequency of operation of said beamformer; and wherein said further transmission line comprises first and second portions, said first portion of said further transmission line extending on said integrated-circuit substrate from said first individual port to said transition port of said integrated-circuit dielectric substrate, said second portion of said further transmission line extending from said transition port vertically through at least one layer of said layered stack structure to a further standard-impedance port.

7. A beamformer according to claim 6, wherein said further transmission line extends through at least three layers of said layered stack structure.

8. A beamformer according to claim 6, further comprising a further standard-impedance transmission line extending from said standard-impedance port to a standard impedance load or source.

9. A beamformer according to claim 6, wherein at least one of said plurality of power divider/combiners has an unequal power division.

10. A beamformer according to claim 6, wherein said ground plane is mechanically affixed and electrically connected to at least one electrically conductive ground conductors of said plurality of stripline printed-circuit boards.

11. A beamformer according to claim 6, wherein said ground plane is mechanically affixed and electrically connected to all of electrically conductive ground conductors of said plurality of stripline printed-circuit boards.

12. A beamformer for coupling antenna ports to at least one common port, said beamformer comprising:

a plurality of stripline printed-circuit boards, at least some of said printed-circuit boards including first and second juxtaposed dielectric sheets, and a strip conductor lying therebetween, said juxtaposed dielectric sheets of each of said stripline printed-circuit boards defining a dielectric layer defining broad first and second surfaces, and also including electrically conductive ground conductors lying on said broad first and second surfaces of said dielectric layer, said plurality of stripline printed-circuit boards being stacked with said first broad surface of one of said boards being in mechanical contact with said second broad surface of another one of said boards, to thereby define a layered stack structure;

a plurality of power divider/combiners each including a common port, at least first and second individual ports, and resistances interconnecting said individual ports, at least one of said power divider/combiners including a second transmission line, and also including a first transmission line extending from said common port to said first individual port, at least portions of said first and second transmission lines being in the form of an integrated strip conductor overlying an integrated-circuit dielectric substrate, which in turn overlies and is affixed to an electrically conductive ground plane, said first transmission line having a lower characteristic impedance than said second transmission line, said electrically conductive ground plane of said integrated circuit being mechanically affixed and electrically connected to one of the ground conductors of said layered stack structure; and a further transmission line coupled to said first individual port of said at least one of said power divider/combiners, said further transmission line extending from said first individual port to a transition port of said integrated-circuit dielectric substrate, the electrical length of said further transmission line being selected to be one-quarter wavelength at the frequency of operation of said beamformer, wherein said further transmission line comprises first and second portions, said first portion of said further transmission line extending from said first individual port to said transition port of said integrated-circuit dielectric substrate, and overlying said integrated-circuit dielectric substrate, said second portion of said further transmission line extending from said transition port vertically through at least one layer of said juxtaposed printed-circuit boards to a further standard-impedance port.

13. A beamformer according to claim 12, wherein said further transmission line extends through at least three layers of said layered stack structure.

14. A beamformer according to claim 12, further comprising a further standard-impedance transmission line extending from said standard-impedance port to a standard-impedance load or source.

15. A beamformer according to claim 12, wherein at least one of said plurality of power divider/combiners has an unequal power division.

16. A beamformer according to claim 12, wherein said electrically conductive ground plane is mechanically affixed and electrically connected to all of said ground conductors.

* * * * *